(12) United States Patent
Ide et al.

(10) Patent No.: US 12,237,315 B2
(45) Date of Patent: Feb. 25, 2025

(54) SEMICONDUCTOR DEVICE HAVING PLURAL STACKED FIRST CHIPS SEALED IN A SEALING PORTION AND A SECOND CHIP DISPOSED IN A RECESS PROVIDED IN THE SEALING PORTION

(71) Applicant: Kioxia Corporation, Tokyo (JP)

(72) Inventors: Takayuki Ide, Yokkaichi Mie (JP); Kazuhiro Kato, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 410 days.

(21) Appl. No.: 17/692,643

(22) Filed: Mar. 11, 2022

(65) Prior Publication Data

US 2023/0083522 A1    Mar. 16, 2023

(30) Foreign Application Priority Data

Sep. 14, 2021 (JP) .................... 2021-149156

(51) Int. Cl.
*H01L 23/495* (2006.01)
*H01L 21/56* (2006.01)
*H01L 23/00* (2006.01)
*H01L 23/31* (2006.01)
*H01L 25/10* (2006.01)

(52) U.S. Cl.
CPC .......... *H01L 25/105* (2013.01); *H01L 21/565* (2013.01); *H01L 23/3128* (2013.01); *H01L 23/3135* (2013.01); *H01L 24/16* (2013.01); *H01L 24/48* (2013.01); *H01L 2224/16227* (2013.01); *H01L 2224/16237* (2013.01); *H01L 2224/16238* (2013.01); *H01L 2224/4801* (2013.01); *H01L 2224/4805* (2013.01); *H01L 2224/48228* (2013.01); *H01L 2224/48229* (2013.01); *H01L 2225/0651* (2013.01); *H01L 2225/06562* (2013.01); *H01L 2225/1088* (2013.01); *H01L 2924/1431* (2013.01);
(Continued)

(58) Field of Classification Search
CPC ....... H01L 21/565; H01L 24/16; H01L 24/48; H01L 2224/16238; H01L 2924/1434
USPC ........................................................ 257/668
See application file for complete search history.

(56) References Cited

U.S. PATENT DOCUMENTS 9,640,513 B2 * 5/2017 Lee ..................... H01L 25/105
9,917,072 B2 3/2018 Yu et al.
2016/0365340 A1 * 12/2016 Tajima ................ H01L 21/3043

FOREIGN PATENT DOCUMENTS

JP        2017005187 A    1/2017

* cited by examiner

*Primary Examiner* — Caleb E Henry
*Assistant Examiner* — Dilinh P Nguyen
(74) *Attorney, Agent, or Firm* — Holtz, Holtz & Volek PC

(57) ABSTRACT

According to one embodiment, there is provided a semiconductor device including a support, multiple first chips, a first sealing portion, a second chip, multiple first terminals and a second terminal. The multiple first chips are stacked on the support. The first sealing portion seals multiple first chips and has a recessed portion including a bottom surface separated from multiple first chips on a surface opposite to the support. The second chip is disposed in the recessed portion and has a function different from a function of the first chips. The multiple first terminals correspond to multiple first chips, each of multiple first terminals extending in a stacking direction from a surface of the first chip opposite to the support and penetrating the first sealing portion. The second terminal is disposed on a surface of the second chip opposite to the support.

20 Claims, 14 Drawing Sheets

(52) U.S. Cl.
CPC ............... *H01L 2924/1434* (2013.01); *H01L 2924/1815* (2013.01); *H01L 2924/182* (2013.01)

SEMICONDUCTOR DEVICE HAVING PLURAL STACKED FIRST CHIPS SEALED IN A SEALING PORTION AND A SECOND CHIP DISPOSED IN A RECESS PROVIDED IN THE SEALING PORTION

CROSS-REFERENCE TO RELATED APPLICATIONS

This application is based upon and claims the benefit of priority from Japanese Patent Application No. 2021-149156, filed on Sep. 14, 2021; the entire contents of which are incorporated herein by reference.

FIELD

Embodiments described herein relate generally a semiconductor device.

BACKGROUND

In a semiconductor device, a plurality of chips may be stacked and a terminal may extend from each chip in the stacking direction. In the semiconductor device, it is desirable to appropriately arrange other chips in addition to multiple chips.

DETAILED DESCRIPTION

In general, according to one embodiment, there is provided a semiconductor device including a support, multiple first chips, a first sealing portion, a second chip, multiple first terminals and a second terminal. The multiple first chips are stacked on the support. The first sealing portion seals multiple first chips and has a recessed portion including a bottom surface separated from multiple first chips on a surface opposite to the support. The second chip is disposed in the recessed portion and has a function different from a function of the first chips. The multiple first terminals correspond to multiple first chips, each of multiple first terminals extending in a stacking direction from a surface of the first chip opposite to the support and penetrating the first sealing portion. The second terminal is disposed on a surface of the second chip opposite to the support.

Exemplary embodiments of a semiconductor device will be explained below in detail with reference to the accompanying drawings. The present invention is not limited to the following embodiments.

First Embodiment

Figure 1:
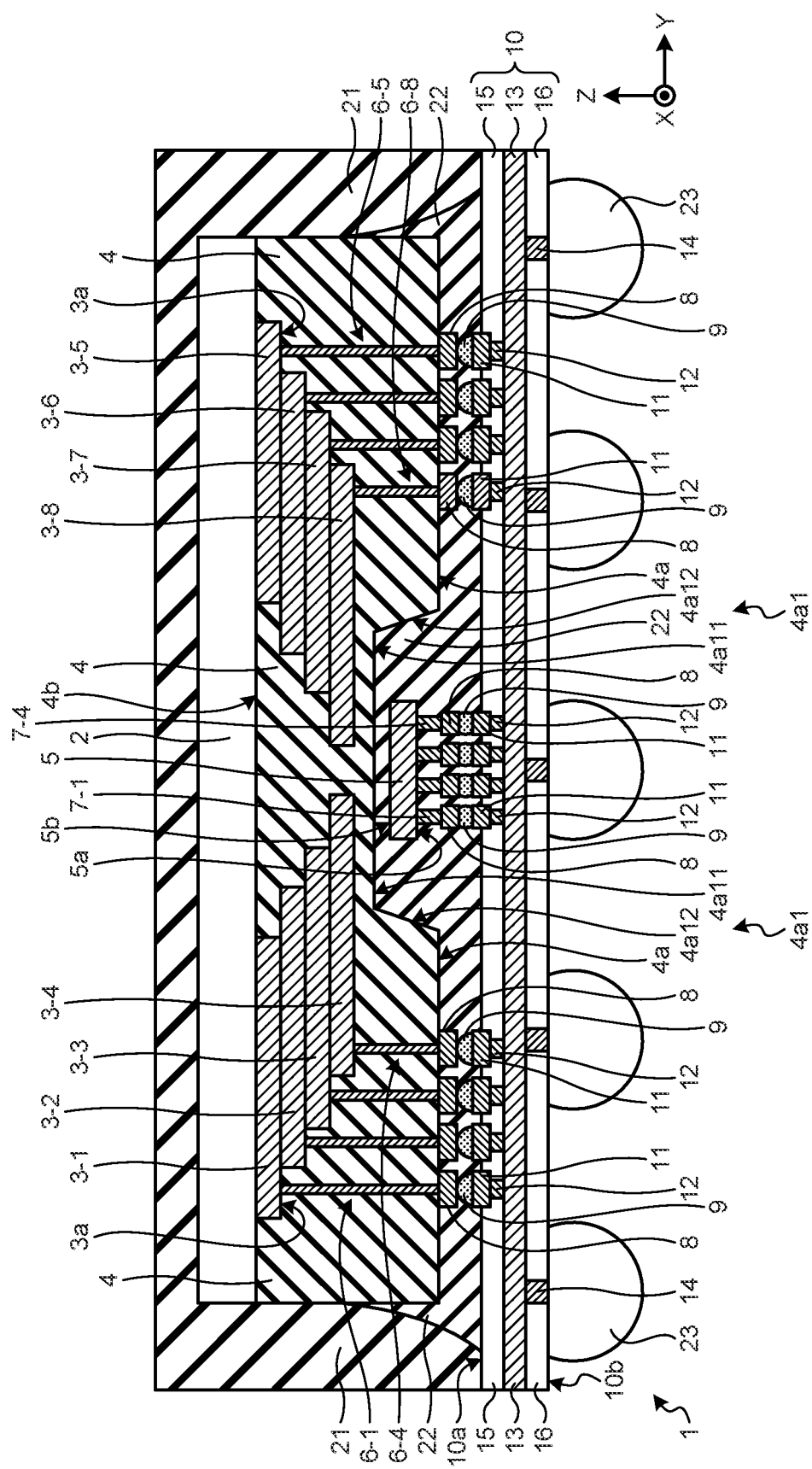
FIG. 1 is a cross-sectional view illustrating a configuration of a semiconductor device according to a first embodiment.

The semiconductor device according to the first embodiment is configured such that a plurality of chips is stacked and a terminal (vertical wire) extends from each chip in the stacking direction. A semiconductor device 1 configured as illustrated, for example, in FIG. 1. FIG. 1 is a cross-sectional view illustrating a configuration of the semiconductor device 1. Hereinafter, a direction perpendicular to the main surface of a support 2 is referred to as a Z direction, and two directions straight to each other in a plane perpendicular to the Z direction are respectively referred to as an X direction and a Y direction.

The semiconductor device 1 includes the support 2, a plurality of chips 3-1 to 3-8, a sealing portion 4, a chip 5, a plurality of terminals 6-1 to 6-8, a plurality of terminals 7-1 to 7-4, a sealing portion 22, external electrodes 23, a substrate 10, and a sealing portion 21.

The support 2 is a plate-shaped member extending in the XY direction. The support 2 has a rectangular shape in XY plan view. The support 2 has rigidity suitable for supporting multiple chips 3-1 to 3-8. The support 2 can be formed of a material suitable for having predetermined rigidity (for example, glass, glass cloth, and silicon).

Multiple chips 3-1 to 3-8 are disposed on an −Z side of the support 2, and can be stacked stepwise half by half. Multiple chips 3-1 to 3-4 are stacked stepwise on a −Y side of multiple chips 3-5 to 3-8. Multiple chips 3-5 to 3-8 are stacked stepwise on a +Y side of multiple chips 3-5 to 3-8. Each of the chips 3-1 to 3-8 has a function different from that of the chip 5, and is, for example, a memory chip capable of data storage.

The sealing portion 4 seals multiple chips 3-1 to 3-8. The sealing portion 4 can be formed of a first insulator having thermoplasticity such as mold resin. The sealing portion 4 has a front surface 4a and a back surface 4b. The back surface 4b is in contact with the support 2. The front surface 4a is a main surface opposite to the support 2. The sealing portion 4 has a recessed portion 4a1 on the front surface 4a. The recessed portion 4a1 is a space recessed from the front surface 4a of the sealing portion 4 to a side. The recessed portion 4a1 can take any shape as long as the chip 5 can be accommodated. The recessed portion 4a1 is disposed at a position where the chip 5 can be accommodated, and may be disposed, for example, in the vicinity of the center of the front surface 4a in XY plan view (see FIG. 3).

The depth of the recessed portion 4a1 is smaller than a Z-direction depth of the chips 3-4 and 3-8 with respect to the front surface 4a. The Z position of the hack surface 4b is on the −Z side relative to the Z position of the front surfaces (−Z-side surfaces) of the chips 3-4 and 3-8.

The recessed portion 4a1 has a bottom surface 4a11 and a side surface 4a12. The bottom surface 4a11 extends in the XY direction. The bottom surface 4a11 is separated from multiple chips 3-1 to 3-8 in the Z direction. The bottom surface 4a11 is separated in the Z direction from the chip 3-4 on the most −Z side among multiple chips 3-1 to 3-4 and is separated in the Z direction from the chip 3-8 on the most −Z side among multiple chips 3-5 to 3-8. The bottom surface 4a11 may be substantially parallel to a front surface 3a of the chip 3-4 and may be substantially parallel to a front surface 3a of the chip 3-8. The recessed portion 4a1 may be, for example, a substantially rectangular parallelepiped hole, or may have a substantially rectangular shape in XY plan view. The area of the open end of the recessed portion 4a1 is larger than the area of the bottom surface 4a11. An X-direction width of the open end of the recessed portion 4a1 is larger than an X-direction width of the bottom surface 4a11. A Y-direction width of the open end of the recessed portion 4a1 is larger than a Y-direction width of the bottom surface 4a11.

The area of the open end of the recessed portion 4a1 is larger than the area of the chip 5. The X-direction width of the open end of the recessed portion 4a1 is larger than an X-direction width of the chip 5. The Y-direction width of the open end of the recessed portion 4a1 is larger than a Y-direction width of the chip 5.

The area of the bottom surface 4a11 is larger than the area of the chip 5. The X-direction width of the bottom surface 4a11 is larger than the X-direction width of the chip 5. The Y-direction width of the bottom surface 4a11 is larger than the Y-direction width of the chip 5.

Multiple terminals 6-1 to 6-8 correspond to multiple chips 3-1 to 3-8. Each of the terminals 6-1 to 6-8 extends in the −Z direction from a surface (−Z-side surface) 3a of a corresponding chip 3 opposite to the support 2, penetrates the sealing portion 4, and reaches the front surface 4a. Each of the terminals 6-1 to 6-8 may be connected to the corresponding chip 3 in plural per a chip. Each of the terminals 6-1 to 6-8 may linearly extend in the direction. Each of the terminals 6-1 to 6-8 is an upright terminal, and may have rigidity capable of maintaining a linear shape.

For example, each of the terminals 6-1 to 6-8 may have a diameter larger than that of a wire used for wire bonding type mounting. Each of the terminals 6-1 to 6-8 is a vertically extending wire, and is also referred to as a vertical wire. When each of the terminals 6-1 to 6-8 is configured as an upright type, the arrangement pitch between the terminals 6-1 to 6-8 can be easily a narrow pitch.

In a case where multiple chips 3-1 to 3-8 are stacked stepwise half by half, multiple terminals 6-1 to 6-8 may have different lengths stepwise half by half. The +Z-side end portions of multiple terminals 6-1 to 6-4 have the Z positions that are lowered stepwise on the −Y side of multiple terminals 6-5 to 6-8. The +Z-side end portions of multiple terminals 6-5 to 6-8 have the Z positions that are lowered stepwise on the +Y side of multiple terminals 6-5 to 6-8. The −Z-side end portions of multiple terminals 6-1 to 6-8 may have substantially equal Z positions. The −Z-side end portion of each of the terminals 6-1 to 6-8 is connected to an electrode pattern 11 of the substrate 10 via an electrode 8 and a ball bump 9. Each of the terminals 6-1 to 6-8 can be formed of a conductive material containing metal (for example, gold) as a main component.

The chip 5 is disposed on the −Z side of the support 2 and is disposed on the −Z side of multiple chips 3-1 to 3-8. The chip 5 has a function different from that of the chips 3, and is, for example, a controller chip capable of controlling multiple chips 3-1 to 3-8. The chip 5 is electrically connected to multiple chips 3-1 to 3-8. The chip 5 is desirably disposed in the vicinity of the center of the semiconductor device 1 in XY plan view in order to make the wiring lengths to the chips 3-1 to 3-8 uniform. Therefore, the chip 5 is disposed in the recessed portion 4a1.

A back surface (+Z-side surface) 5b of the chip 5 may be slightly separated from the bottom surface 4a11 of the recessed portion 4a1 in the −Z direction. Thus, the chip 5 is separated in the −Z direction from the chips 3-4 and 3-8 on the most −Z side among multiple chips 3-1 to 3-8.

Multiple terminals 7-1 to 7-4 are disposed on a front surface (−Z-side surface) 5a of the chip 5. Each of the terminals 7-1 to 7-4 may extend in a columnar shape in the −Z direction. The maximum width of each of the terminals 7-1 to 7-4 in the XY direction is larger than the maximum width of each of the terminals 6-1 to 6-8 in the XY direction. Each of the terminals 7-1 to 7-4 can be formed of a stack of a plurality of layers. Each of multiple layers can be formed of a conductive material containing an alloy as a main component, such as a solder alloy layer or a copper alloy layer. Multiple layers may include layers having different compositions, or layers having different compositions and layers having the same composition may be mixed.

The +Z-side end portions of multiple terminals 7-1 to 7-4 are coupled to the front surface 5a of the chip 5. The −Z-side end portions of multiple terminals 7-1 to 7-4 may have substantially equal Z positions. The Z-direction height of the −Z-side end portions of multiple terminals 7-1 to 7-4 from the support 2 may be substantially equal to the Z-direction height of the −Z-side end portions of multiple terminals 6-1 to 6-8 from the support 2. The −Z-side end portion of each of the terminals 7-1 to 7-4 is connected to an electrode pattern 11 of the substrate 10 via an electrode 8 and a ball bump 9. Each of the terminals 7-1 to 7-4 is a columnar bump and is also called a pillar bump. When each of the terminals 7-1 to 7-4 is configured in a columnar shape, the arrangement pitch between the terminals 7-1 to 7-4 can be easily a narrow pitch.

The sealing portion 22 fills the recessed portion 4a1 and seals the chip 5. The sealing portion 22 fills a gap between the sealing portion 4 and the substrate 10, and seals the electrodes 8, the ball bumps 9, and the electrode patterns 11. The sealing portion 22 covers a −Z-side surface of the sealing portion 4 and covers a front surface 10a of the substrate 10. The sealing portion 22 can be formed of a second insulator having thermoplasticity such as mold resin. The second insulator is different in composition from the first insulator.

The sealing portion 21 covers and seals the support 2, the sealing portion 4, and the sealing portion 22 from the outside. The sealing portion 21 may reach the front surface 10a of the substrate 10. The sealing portion 21 can be formed of a third insulator having thermoplasticity such as mold resin. The third insulator is different in composition from the first insulator and is different in composition from the second insulator.

The sealing portion 4, the sealing portion 21, and the sealing portion 22 may contain an inorganic filler in an insulating resin. At this time, the content of the filler in the sealing portion 4 and the sealing portion 21 may be larger than the content of the filler in the sealing portion 22.

The thermal expansion coefficients of the sealing portion 4 and the sealing portion 21 may be smaller than the thermal expansion coefficient of the sealing portion 22.

The Young's moduli of the sealing portion 4 and the sealing portion 21 may be larger than the Young's modulus of the sealing portion 22.

The substrate 10 includes multiple electrode patterns 11, a plurality of through-hole electrodes 12, a conductive layer 13, a plurality of through-hole electrodes 14, a prepreg layer 15, and a core layer 16. Each of multiple electrode patterns 11 is exposed on the front surface 10a of the substrate 10, and each of multiple through-hole electrodes 14 is exposed on a back surface 10b of the substrate 10. Each of the electrode patterns 11, each of the through-hole electrodes 12, the conductive layer 13, and each of the through-hole electrodes 14 can be formed of a material containing a conductive material (for example, copper) as a main component. Each of the prepreg layer 15 and the core layer 16 can be formed of a material containing an insulator (for example, an organic substance such as plastic) as a main component.

Note that, in FIG. 1, for the sake of simplicity, the conductive layer 13 is illustrated in a form of being connected to multiple electrode patterns 11, multiple through-hole electrodes 12, and multiple through-hole electrodes 14, but in practice, predetermined wiring formed, and a predetermined electrode pattern 11, a predetermined through-hole electrode 12, and a predetermined through-hole electrode 14 may be selectively connected.

Multiple external electrodes 23 are disposed on the back surface 10b of the substrate 10, and are each joined to the through-hole electrodes 14. The arrangement pitch of multiple external electrodes 23 in the X direction is larger than the arrangement pitch of multiple terminals 6-1 to 6-8 in the X direction. The arrangement pitch of multiple external electrodes 23 in the X direction is larger than the arrangement pitch of multiple terminals 7-1 to 7-4 in the X direction. Similarly, the arrangement pitch of multiple external electrodes 23 in the Y direction is larger than the arrangement pitch of multiple terminals 6-1 to 6-8 in the Y direction. The arrangement pitch of multiple external electrodes 23 in the Y direction is larger than the arrangement pitch of multiple terminals 7-1 to 7-4 in the Y direction. Thus, the semiconductor device 1 can be easily connected to wide-pitch external terminals (for example, terminals on a motherboard) while narrowing the arrangement pitch between the terminals 6-1 to 6-8 and the arrangement pitch between the terminals 7-1 to 7-4.

Next, a method of manufacturing the semiconductor device 1 will be described with reference to FIGS. 1 to 5C. FIG. 1 is a cross-sectional view illustrating a configuration of the semiconductor device 1, but is used as a cross-sectional view illustrating a method of manufacturing the semiconductor device 1. FIGS. 2A to 2D, 4A to 4C, and 5A to 5C are cross-sectional views illustrating a method of manufacturing the semiconductor device 1. FIG. 3 is a plan view illustrating a method of manufacturing the semiconductor device 1.

Figure 2A:
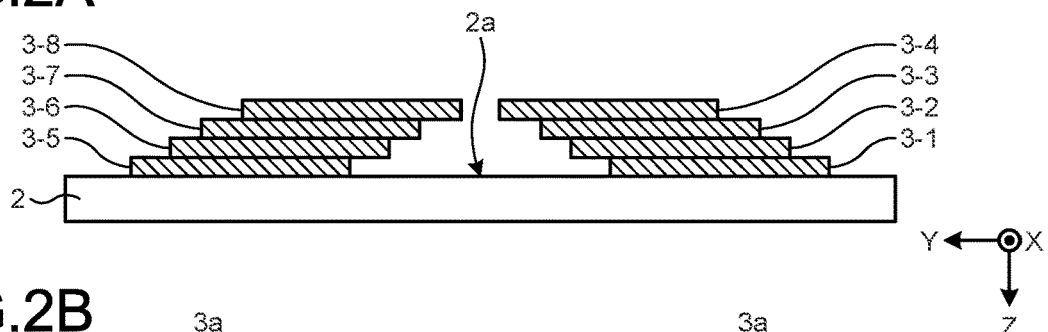
FIGS. 2A to 2D are cross-sectional views illustrating a method of manufacturing the semiconductor device according to the first embodiment.
Figure 3:
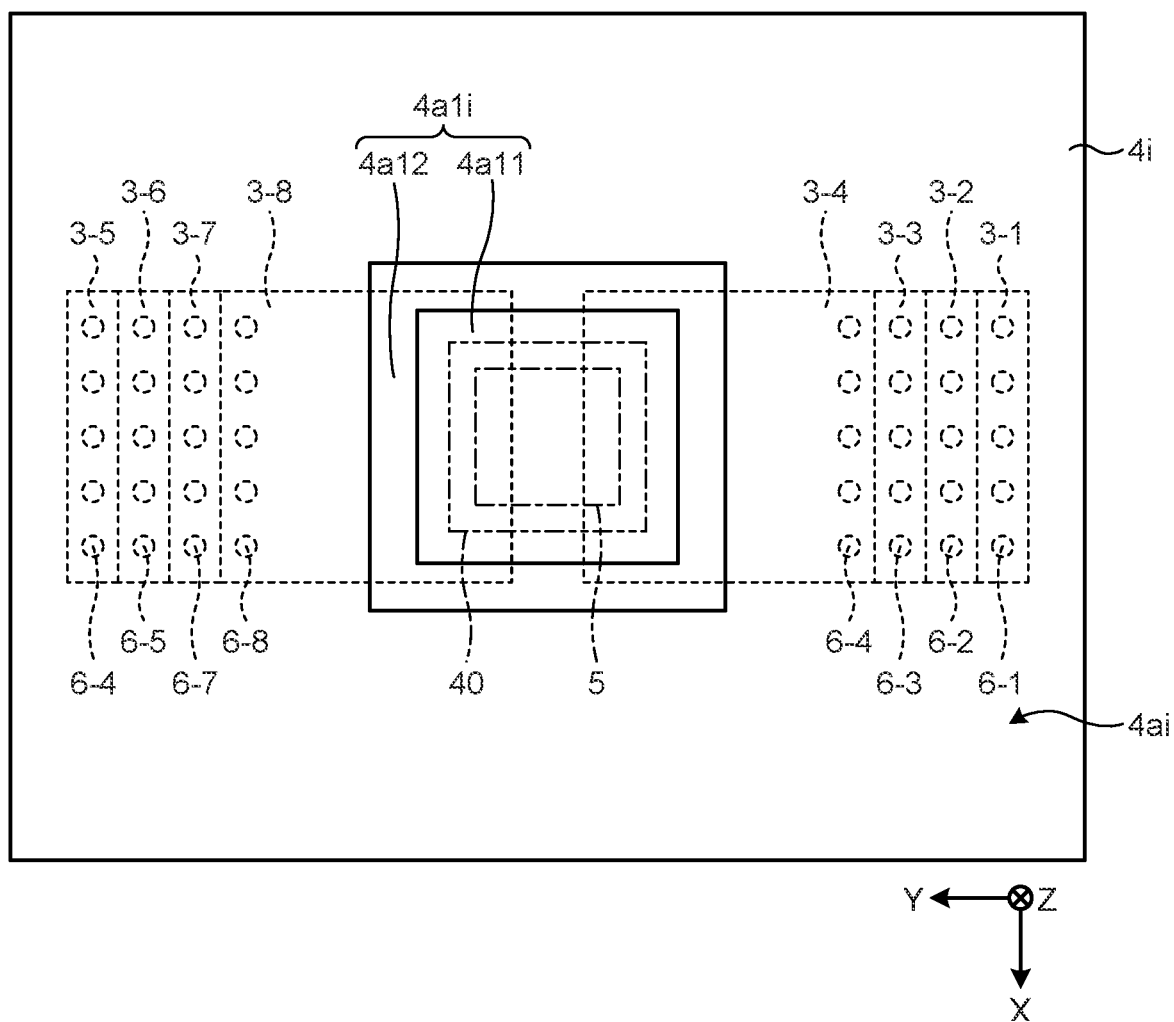
FIG. 3 is a plan view illustrating a method of manufacturing the semiconductor device according to the first embodiment.

In the process illustrated in FIG. 2A, the support 2 is prepared. The support 2 is a plate-shaped member extending in the XY direction. The support 2 can be formed of a material suitable for having predetermined rigidity (for example, glass, glass cloth, and silicon). Multiple chips 3-1 to 3-8 are stacked stepwise on a –Z-side surface 2a of the support 2.

For example, the chip 3-1 can be bonded to a –Y side region of the –Z-side surface 2a of the support 2 via an adhesive, an adhesive film, or the like. The chip 3-2 can be bonded to the –Z side of the chip 3-1 in a state where the XY plane position is shifted to, for example, the +Y side. The chip 3-3 can be bonded to the –Z side of the chip 3-2 via an adhesive or an adhesive film in a state where the XY plane position is shifted to, for example, the +Y side. The chip 3-4 can be bonded to the –Z side of the chip 3-3 in a state where the XY plane position is shifted to, for example, the +Y side.

Thus, multiple chips 3-1 to 3-4 are stacked stepwise in the –Y side region of the surface 2a of the support 2 while the Y position is sequentially shifted to the +Y side. Each of the chips 3-1 to 3-4 is face-up mounted with the front surfaces 3a on the –Z side. The front surfaces 3a of multiple chips 3-1 to 3-4 are sequentially increased in Z-direction height from the support 2. Similarly, multiple chips 3-5 to 3-8 are stacked stepwise in the +Y side region of the surface 2a of the support 2 while the Y position is sequentially shifted to the –Y side. Each of the chips 3-5 to 3-8 is face-up mounted with the front surfaces 3a on the –Z side. The front surfaces 3a of multiple chips 3-5 to 3-8 are sequentially increased in Z-direction height from the support 2.

Figure 2B:
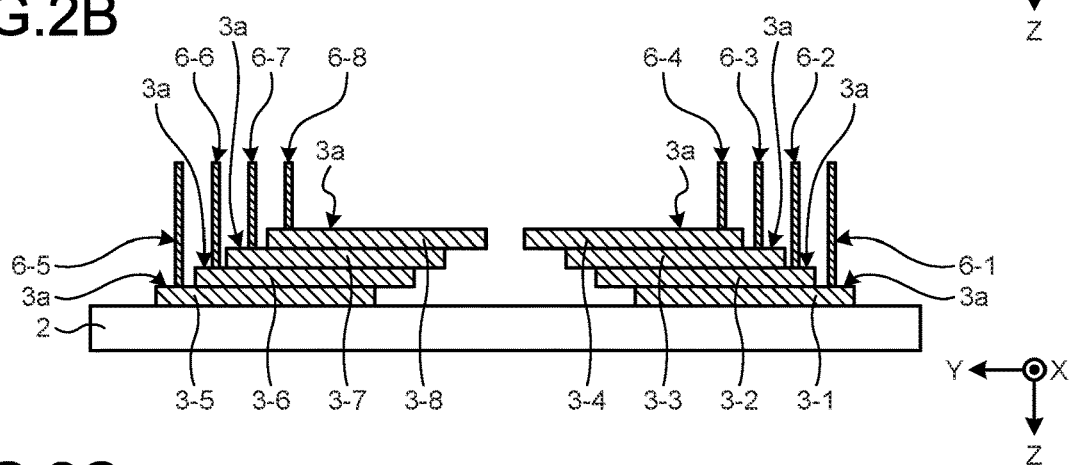

In the process illustrated in FIG. 2B, multiple terminals 6-1 to 6-8 are coupled to multiple chips 3-1 to 3-8. Multiple terminals 6-1 to 6-8 correspond to multiple chips 3-1 to 3-8. The lengths of multiple terminals 6-1 to 6-8 can be different from each other corresponding to the Z-direction heights of multiple chips 3-1 to 3-8 from the support 2 (for example, to accommodate the difference in Z-direction height). Each of the terminals 6-1 to 6-8 can be coupled to an electrode pad on the front surface 3a of the corresponding chip 3 at its +Z-side end portion in an upright position in the Z direction. Note that a plurality of terminals 6 may extend from each chip 3 (see FIG. 3).

For example, the lengths of multiple terminals 6-1 to 6-4 are sequentially shortened in accordance with a sequential increase in Z-direction height of the front surfaces 3a of multiple chips 3-1 to 3-4 from the support 2. Thus, in a state where multiple terminals 6-1 to 6-4 is coupled to multiple chips 3-1 to 3-4, the Z positions of the –Z-side end portions thereof are close to each other. Similarly, the lengths of multiple terminals 6-5 to 6-8 are sequentially shortened in accordance with a sequential increase in Z-direction height of the front surfaces 3a of multiple chips 3-5 to 3-8 from the support 2. Thus, in a state where multiple terminals 6-5 to 6-8 is coupled to multiple chips 3-5 to 3-8, the Z positions of the –Z-side end portions thereof are close to each other.

Figure 2C:
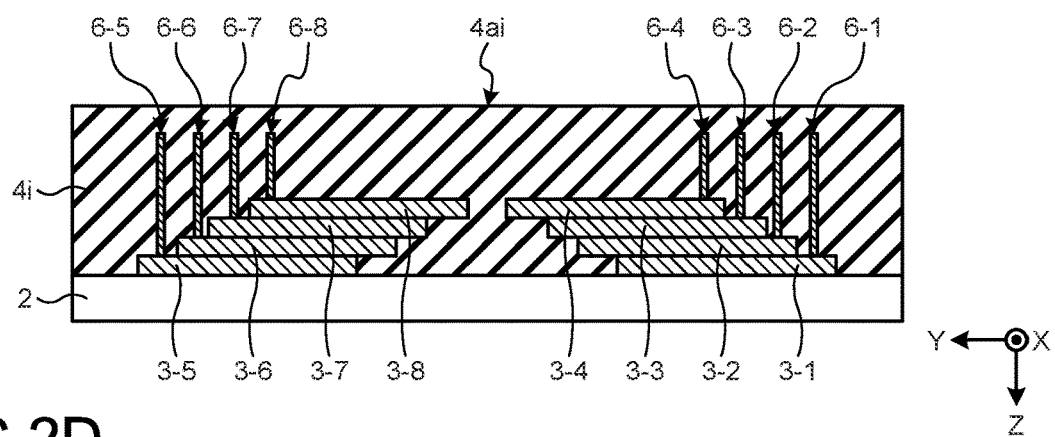

In the process illustrated in FIG. 2C, a sealing portion 4i is formed on the –Z side of the support 2. That is, the front surfaces and side surfaces of multiple chips 3-1 to 3-8 are covered with the first insulator and the side surfaces and end surfaces of multiple terminals 6-1 to 6-8 are covered with the first insulator to form the sealing portion 4i. The sealing portion 4i can be formed of the first insulator having thermoplasticity such as mold resin. The Z-direction height of the sealing portion 4i from the support 2 is higher than the Z-direction height of the chips 3-4 and 3-8 on the most –Z side and higher than the Z-direction height of each of the terminals 6-1 to 6-8.

Figure 2D:
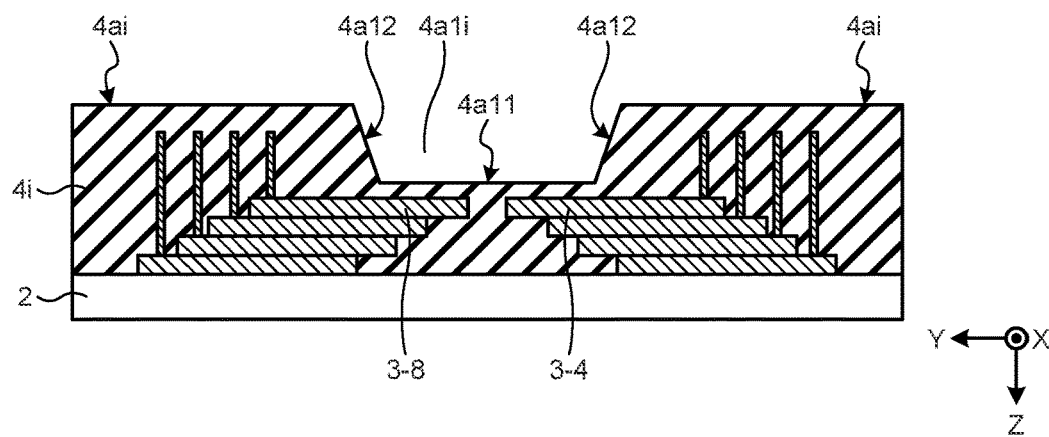

In the process illustrated in FIG. 2D, a recessed portion 4a1i is formed on a −Z-side surface 4ai of the sealing portion 4i. The recessed portion 4a1i is formed to have a depth with respect to the sum of a predetermined depth and a polishing thickness in a later process. The predetermined depth is formed to be smaller than the Z-direction depth of the chips 3-4 and 3-8 with respect to the surface 4a1. The predetermined depth may be equal to or more than the Z-direction height of the chip 5 from the substrate 10 in a state where the chip 5 is mounted on the substrate 10 in a later process. The recessed portion 4a1i may be formed in a tapered shape in which the side surface 4a12 is inclined such that the opening width becomes smaller toward the bottom surface 4a11 in each of XZ cross-sectional view and YZ cross-sectional view. For example, the recessed portion 4a1i may be formed by molding. By preparing a mold including a flat portion having a pedestal portion in the vicinity of the center in the XY direction, heating and melting the first insulator, pouring the first insulator into the mold, cooling the first insulator, and removing the mold, it is possible to form the sealing portion 4i having the recessed portion 4a1i in the vicinity of the center of the front surface in the XY direction. At this time, it is possible to easily remove the mold by forming the pedestal portion into a tapered shape, and it is possible to improve the throughput of the processing of forming the sealing portion 4i. Alternatively, the recessed portion 4a1i may be formed by laser processing. After the sealing portion 4i having a flat surface is formed, the sealing portion 4i having the recessed portion 4a1i in the vicinity of the center of the surface can be formed by irradiating the surface with laser light while controlling the irradiation position in a rectangular shape by NC control or the like. At this time, the recessed portion 4a1i can be formed in a tapered shape due to the characteristics of laser processing.

As illustrated in FIG. 3, the recessed portion 4a1i is formed in the vicinity of the center of the surface 4ai in XY plan view. FIG. 3 exemplifies a configuration in which the recessed portion 4a1i is formed as a substantially rectangular parallelepiped hole (having a substantially rectangular shape in XY plan view). The recessed portion 4a1i is formed such that the X-direction width thereof is larger than the X-direction width of the chip 5. The recessed portion 4a1i is formed such that the Y-direction width thereof is larger than the Y-direction width of the chip 5. With such a configuration of the recessed portion 4a1i, the chip 5 can be accommodated in the recessed portion 4a1i in a later process.

Figure 4A:
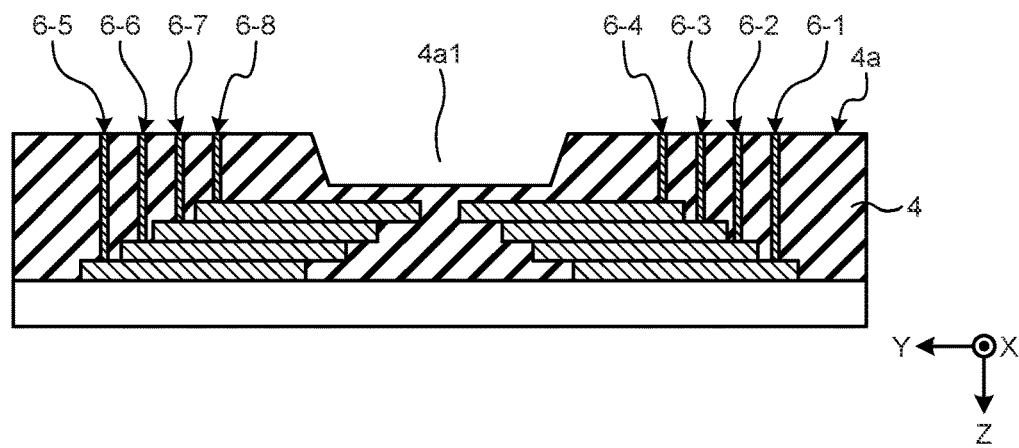
FIGS. 4A to 4C are cross-sectional views illustrating a method of manufacturing the semiconductor device according to the first embodiment.

In the process illustrated in FIG. 4A, the surface 4ai of the sealing portion 4i is polished. For example, a grinder of a polishing apparatus is pressed against the surface 4ai of the sealing portion 4i, and the grinder rotates about an axis perpendicular to the contact surface, and the rotation of the grinder is continued until the −Z-side end portion of each of the terminals 6-1 to 6-8 is exposed to the front surface 4a of the sealing portion 4. The Z-direction thickness of the sealing portion 4 is thinner than that of the sealing portion 4i by an amount corresponding to the polishing thickness. The depth of the recessed portion 4a1 is smaller than that of the recessed portion 4a1i by an amount corresponding to the polishing thickness.

Figure 4B:
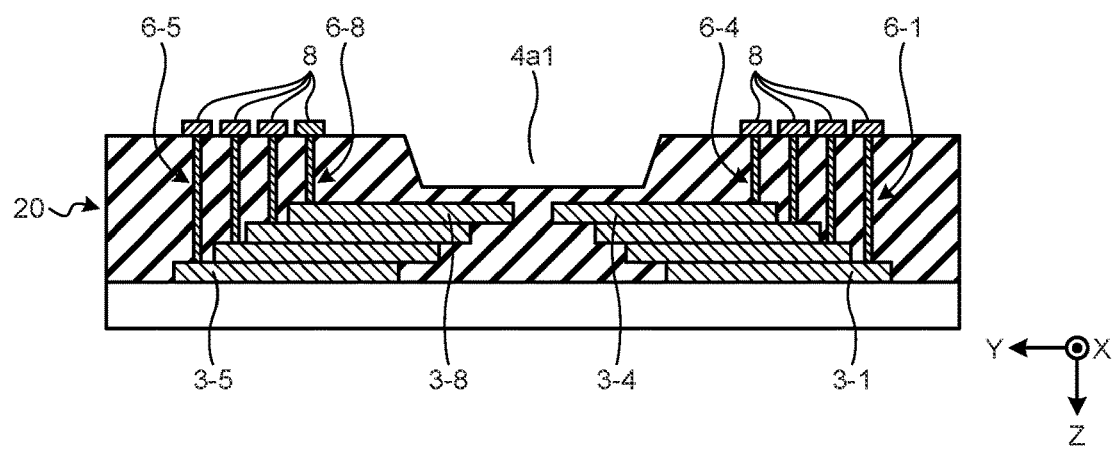

In the process illustrated in FIG. 4B, multiple electrodes 8 are formed on the front surface 4a of the sealing portion 4. Multiple electrodes 8 correspond to multiple terminals 6-1 to 6-8. Each of the electrodes 8 is electrically connected to the −Z-side end portion of the corresponding terminal 6. Each of the electrodes 8 is formed of a conductive material such as metal (for example, copper). Thus, an upper structure 20 in which multiple chips 3-1 to 3-8 are face-up mounted and sealed while being stacked stepwise is obtained.

Figure 4C:
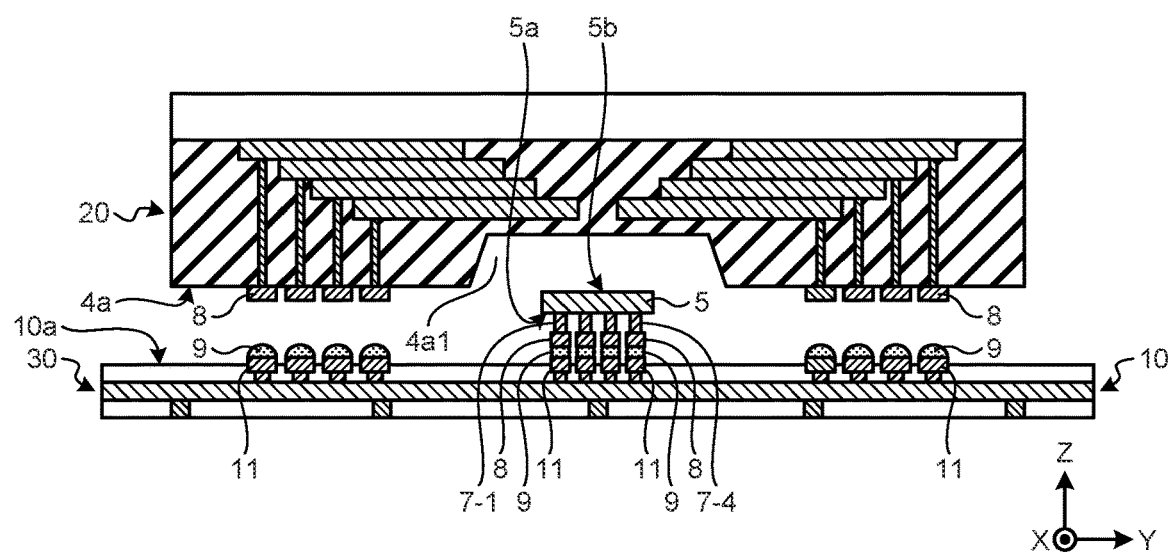

In the process illustrated in FIG. 4C, the substrate 10 is prepared. The ball bump 9 is coupled to each of multiple electrode patterns 11 exposed on the front surface 10a of the substrate 10. The electrode 8 is coupled to each of multiple ball bumps 9 in the vicinity of the center of the substrate 10 in XY plan view.

On the other hand, the chip 5 is prepared. Multiple electrode pads are disposed on the front surface 5a of the chip 5. Multiple terminals 7-1 to 7-4 corresponding to multiple electrode pads are prepared. One end of each of multiple terminals 7-1 to 7-4 is coupled to a corresponding electrode pad on the front surface 5a of the chip 5. Multiple terminals 7-1 to 7-4 also correspond to multiple electrodes 8 in the vicinity of the center of the substrate 10 in XY plan view. The other end of each of multiple terminals 7-1 to 7-4 is coupled to the electrode 8. That is, the chip 5 is face-down mounted on the substrate 10 with the front surface 5a on the −Z side. Thus, a lower structure 30 in which the chip 5 is face-down mounted on the substrate 10 is obtained.

The upper structure 20 and the lower structure 30 are arranged to face each other such that the front surface 4a and the front surface 10a face each other. When viewed from the Z direction, the relative positions of the upper structure 20 and the lower structure 30 are aligned such that the electrodes 8 of the upper structure 20 and the ball bumps 9 of the lower structure 30 overlap each other. At this time, the chip 5 is included inside the recessed portion 4a1 when viewed from the Z direction (see FIG. 3).

Figure 5A:
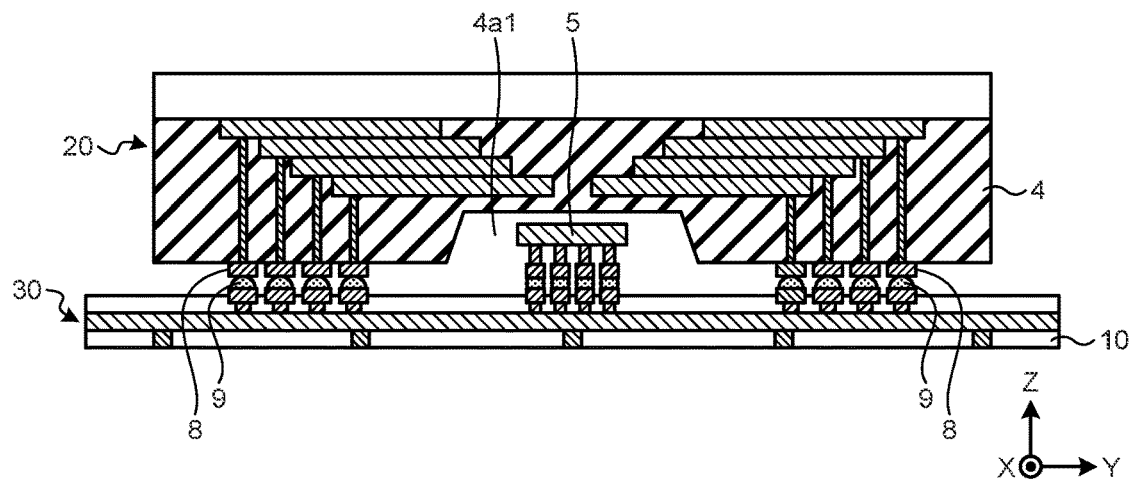
FIGS. 5A to 5C are cross-sectional views illustrating a method of manufacturing the semiconductor device according to the first embodiment.

In the process illustrated in FIG. 5A, the upper structure 20 and the lower structure 30 are relatively brought close to each other in the Z direction. The electrodes 8 of the upper structure 20 and the ball bumps 9 of the lower structure 30 are coupled to each other. The chip 5 is accommodated in the recessed portion 4a1 of the sealing portion 4.

Figure 5B:
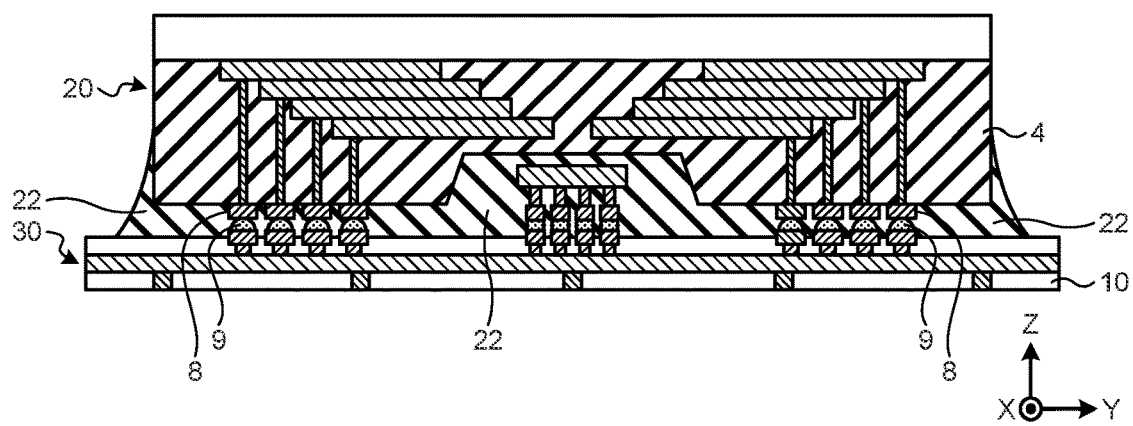

In the process illustrated in FIG. 5B, the gap between the upper structure 20 and the lower structure 30 is sealed by the sealing portion 22. The sealing portion 22 is loaded to fill the recessed portion 4a1 and fill the gap between the sealing portion 4 and the substrate 10. The sealing portion 22 can be formed of a second insulator having thermoplasticity such as mold resin. Thus, the chip 5 is sealed by the sealing portion 22, and the electrodes 8 and the ball bumps 9 are sealed by the sealing portion 22.

Figure 5C:
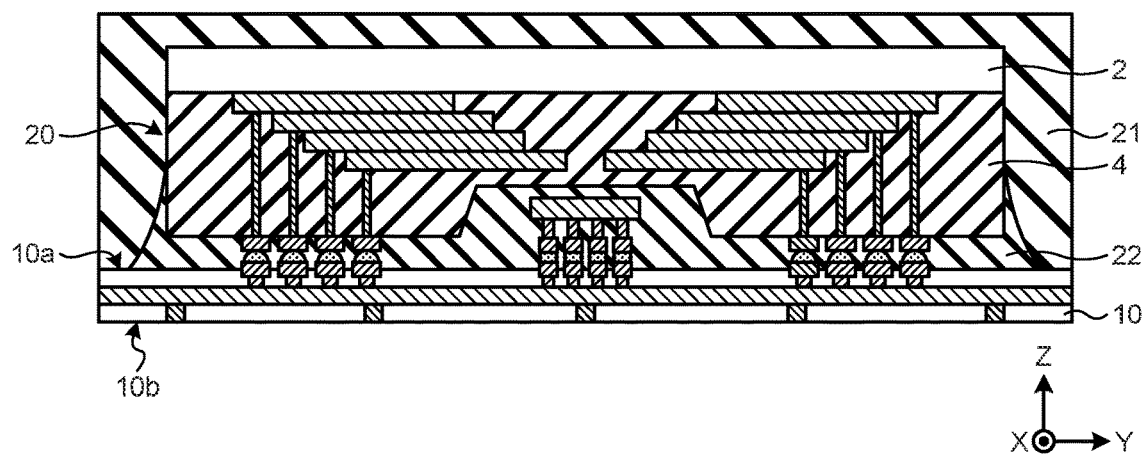

In the process illustrated in FIG. 5C, the outside of the upper structure 20 is sealed by the sealing portion 21. The sealing portion 21 is formed to cover the support 2, the sealing portion 4, and the sealing portion 22 from the outside. The sealing portion 21 may be formed so as to reach the front surface 10a of the substrate 10. The sealing portion 21 can be formed of a third insulator having thermoplasticity such as mold resin. The third insulator is different in composition from the first insulator and is different in composition from the second insulator.

In the process illustrated in FIG. 1, multiple external electrodes 23 are mounted on the back surface 10b of the substrate 10. The external electrodes 23 can be joined to the through-hole electrodes 14 exposed on the back surface 10b of the substrate 10. Then, the semiconductor device 1 is obtained through singulation by cutting.

As described above, in the first embodiment, in the semiconductor device 1, the recessed portion 4a1 is provided in the vicinity of the center of the front surface 4a of the sealing portion 4 in XY plan view that seals multiple stacked chips 3-1 to 3-8. The chip 5 is accommodated in the recessed portion 4a1. Thus, since it is easy to wire the chip 5 to multiple chips 3-1 to 3-8 at substantially equal distances, it is possible to provide the semiconductor device 1 having a structure suitable for appropriately arranging each of multiple chips 3-1 to 3-8 and the chip 5.

Here, a case where multiple chips 3-1 to 3-8 are stacked stepwise on the support 2 and the chip 5 is bonded onto the uppermost (the most −Z-side) chips 3-4 and 3-8 at the time of manufacturing the semiconductor device 1 is considered. In this case, there is a possibility that the chips 3-4 and 3-8 are bent due to stress at the time of bonding or the like and the chip 5 is inclined from an appropriate planar direction.

On the other hand, in the first embodiment, in the semiconductor device 1, the bottom surface 4a11 of the recessed portion 4a1 in which the chip 5 is accommodated is separated in the Z direction from the front surfaces 3a of the uppermost (the most −Z-side) chips 3-4 and 3-8 among multiple chips 3-1 to 3-8 sealed by the sealing portion 4. Thus, it is possible to provide the semiconductor device 1 having a structure suitable for manufacturing by mounting the chip 5 without inclination from an appropriate planar direction.

Here, a case where both the upright terminals 6-1 to 6-8 connected to the chips 3-1 to 3-8 and the terminals 7-1 to 7-4 having a columnar shape mounted on the chip 5 are sealed by the sealing portion 4 at the time of manufacturing the semiconductor device 1 will be considered. In this case, the height of the end varies between the terminals 6-1 to 6-8 and the terminals 7-1 to 7-4. In order to accommodate this variation, the terminals 6-1 to 6-8 and the terminals 7-1 to 7-4 are formed to be high, and the heights are made uniform by polishing. That is, since the terminals 7-1 to 7-4 having a complicated structure (structure of a stack of a plurality of films) as compared with the terminals 6-1 to 6-8 are made high, there is a possibility that the cost of the semiconductor device 1 increases.

On the other hand, in the first embodiment, in the semiconductor device 1, the upright terminals 6-1 to 6-8 are sealed together with the chips 3-1 to 3-8 to which the terminals 6-1 to 6-8 are connected by the sealing portion 4, and the −Z-side end portions are exposed to the front surface 4a of the sealing portion 4. The terminals 7-1 to 7-4 having a columnar shape are mounted on the chip 5 accommodated in the recessed portion 4a1 of the sealing portion 4. Thus, it is possible to suppress the influence of the variation between the terminals 6-1 to 6-8 and the terminals 7-1 to 7-4 with respect to the sealing by the sealing portion 4, and it is possible to suppress the terminals 7-1 to 7-4 to be low. That is, it is possible to provide the semiconductor device 1 suitable for reducing the manufacturing cost.

Figure 6A:
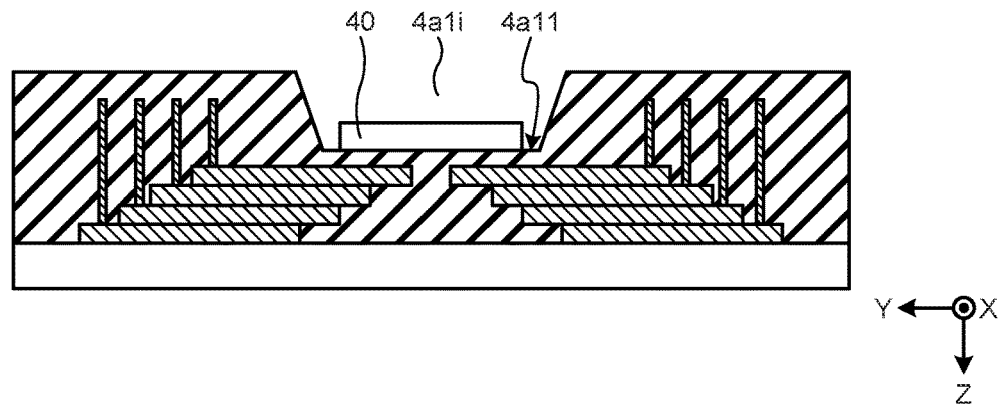
FIGS. 6A to 6C are cross-sectional views illustrating a method of manufacturing a semiconductor device according to a first modification of the first embodiment.
Figure 6B:
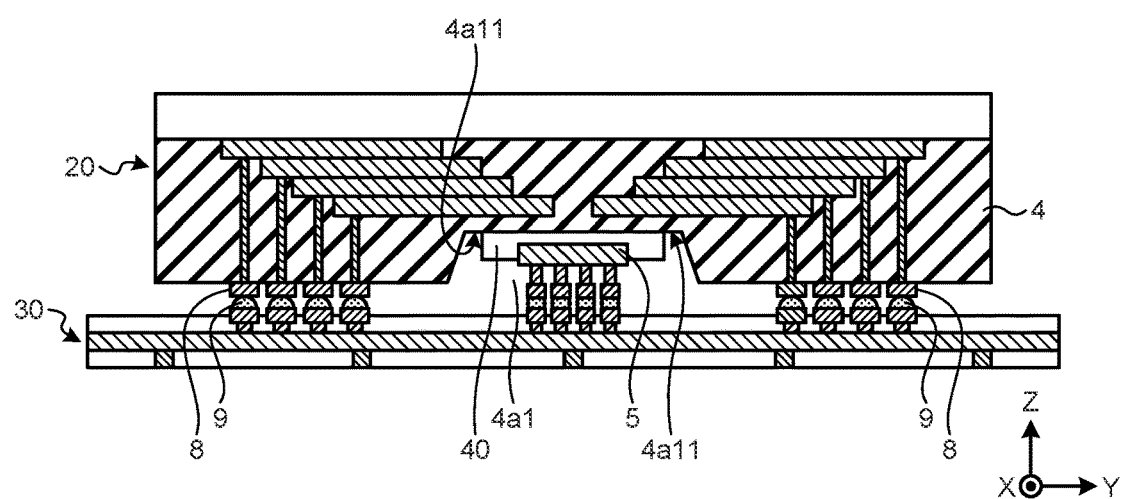
Figure 6C:
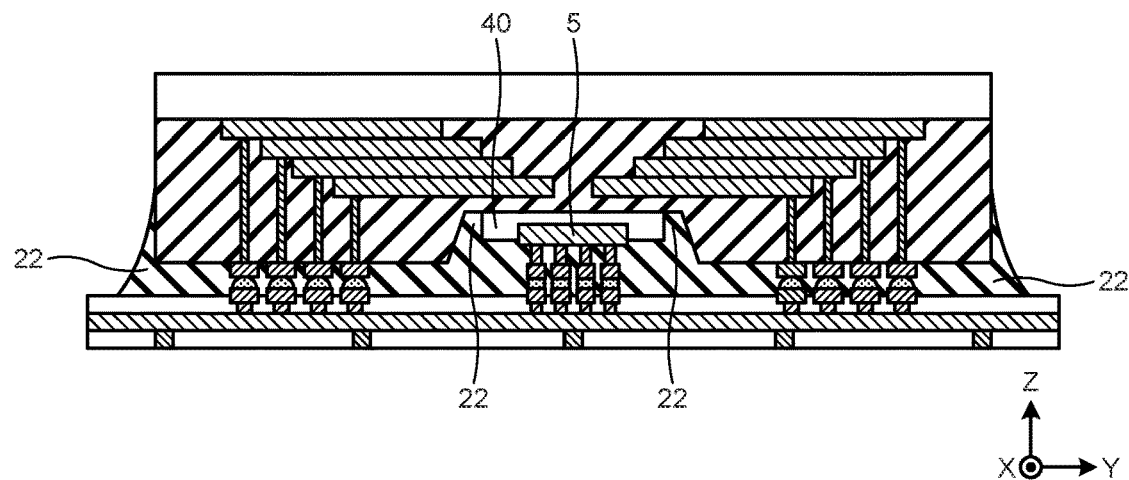

Note that, as illustrated in FIG. 6C, a buffer member 40 may be interposed between the chip 5 and the bottom surface 4a11 of the recessed portion 4a1. FIGS. 6A to 6C are respectively cross-sectional views illustrating a method of manufacturing the semiconductor device according to a first modification of the first embodiment.

For example, in the method of manufacturing the semiconductor device 1, after the processes illustrated in FIGS. 2A to 2D are performed, the process illustrated in FIG. 6A may be performed. In the process illustrated in FIG. 6A, the buffer member 40 is disposed on the bottom surface 4a11 of the recessed portion 4a1. The buffer member 40 is a plate-shaped member extending in the XY direction. The buffer member 40 may be formed of an insulating material having flexibility and elasticity such as a resin-based adhesive. The buffer member 40 is disposed so as to cover the main part of the bottom surface 4a11.

As indicated by the two-dot chain lines in FIG. 3, the buffer member 40 is disposed so as to be included inside the bottom surface 4a11 and to include the chip 5 inside in XY plan view. The XY area of the buffer member 40 is smaller than the XY area of the bottom surface 4a11 and larger than the XY area of the chip 5. The X-direction width of the buffer member 40 is smaller than the X-direction width of the bottom surface 4a11 and larger than the X-direction width of the chip 5. The Y-direction width of the buffer member 40 is smaller than the Y-direction width of the bottom surface 4a11 and larger than the Y-direction width of the chip 5.

After the processes illustrated in FIGS. 4A to 4C are performed, the process illustrated in FIG. 6B is performed instead of the process illustrated in FIG. 5A. In the process illustrated in FIG. 6B, the upper structure 20 and the lower structure 30 are relatively brought close to each other in the Z direction. As in the first embodiment, the electrodes 8 of the upper structure 20 and the ball bumps 9 of the lower structure 30 are coupled to each other. The chip 5 is accommodated in the recessed portion 4a1 of the sealing portion 4 while the back surface of the chip 5 is in contact with the buffer member 40. At this time, the chip 5 is pressed against the buffer member 40 to some extent, but since the buffer member 40 has elasticity, stress on the chip 5 is suppressed.

The process illustrated in FIG. 6C is performed instead of the process illustrated in FIG. 5B. In the process illustrated in FIG. 6C, when the gap between the upper structure 20 and the lower structure 30 is sealed by the sealing portion 22, the recessed portion 4a1 is filled while the exposed surfaces of the buffer member 40 and the chip 5 are covered. At this time, since the main part of the bottom surface 4a11 of the recessed portion 4a1 is covered with the buffer member 40, generation of voids in the sealing portion 22 is suppressed, and the mounting quality can be improved.

Thereafter, as in the first embodiment, the process illustrated in FIG. 5C and the process illustrated in FIG. 1 are performed to manufacture the semiconductor device 1.

As described above, in the semiconductor device according to the first modification of the first embodiment, the buffer member 40 is interposed between the chip 5 and the bottom surface 4a11 of the recessed portion 4a1. Thus, it is possible to provide the semiconductor device 1 having a structure suitable for improving the mounting quality.

Figure 7:
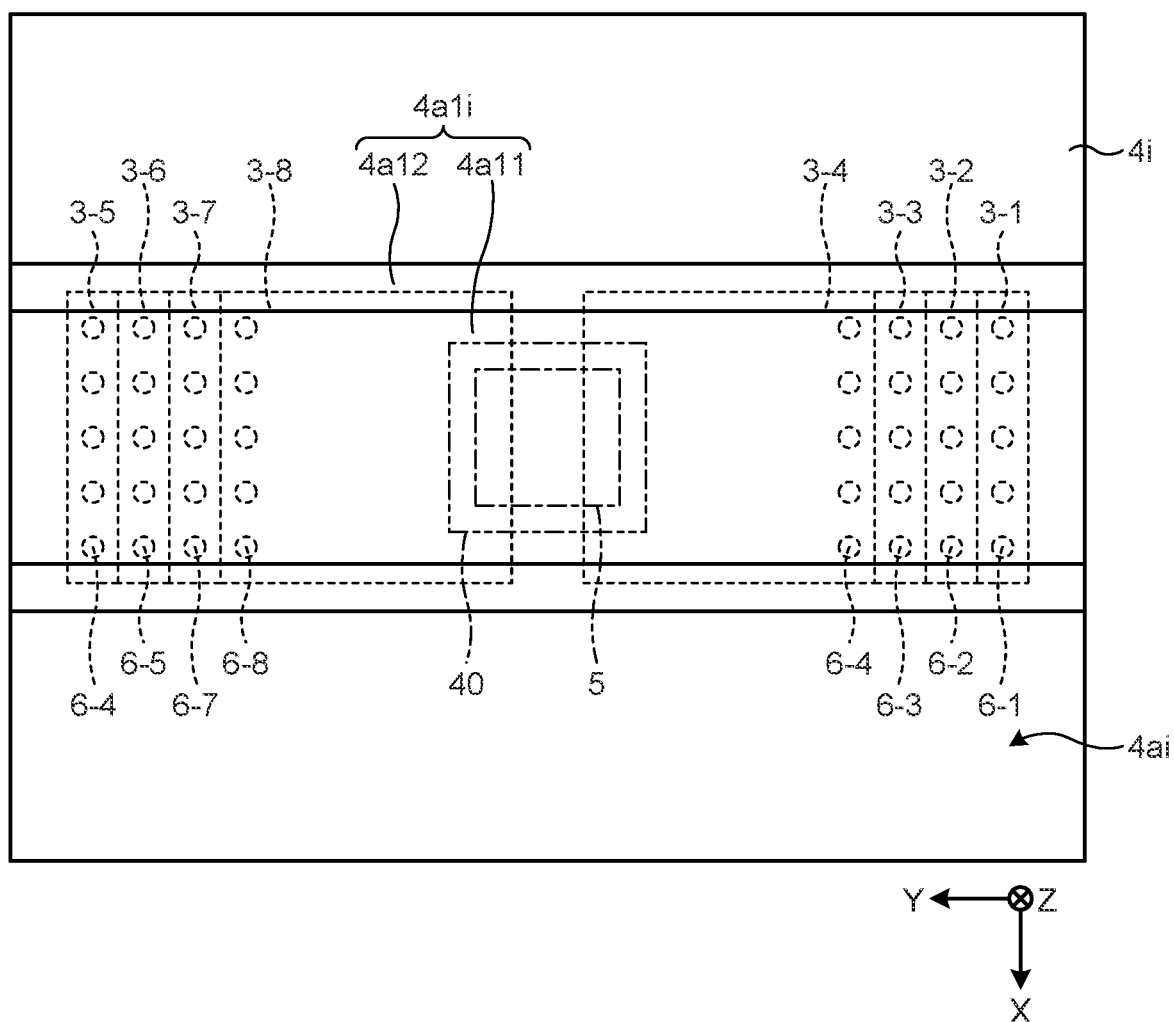
FIG. 7 is a plan view illustrating a method of manufacturing a semiconductor device according to a second modification of the first embodiment.

In addition, the recessed portion 4a1i may have any shape as long as the chip 5 can be accommodated and may, for example, be formed as a groove having a lateral I-shape as illustrated in FIG. 7 (having a substantially lateral I-shape in XY plan view). FIG. 7 is a plan view illustrating a method of manufacturing the semiconductor device 1 according to a second modification of the first embodiment. FIG. 7 exemplifies a configuration in which the recessed portion 4a1i is formed as a lateral I-shaped groove. In this case, unlike the first embodiment, the Y-direction width of the open end of the recessed portion 4a1 is substantially equal to the Y-direction width of the bottom surface 4a11. Note that, as in the first embodiment, the area of the open end of the recessed portion 4a1i is larger than the area of the bottom surface 4a11, and the X-direction width of the open end of the recessed portion 4a1i is larger than the X-direction width of the bottom surface 4a11.

The terminals 6-1 to 6-8 are exposed on the bottom surface of the recessed portion 4a1i. The height of the exposed surfaces of the terminals is low. Therefore, electrodes may be formed separately so as to compensate for the height of the terminals. Alternatively, the electrodes 8 and the ball bumps 9 may be formed high.

The recessed portion 4a1i may be formed in a tapered shape in which the side surface 4a12 is inclined such that the opening width becomes smaller toward the bottom surface 4a11 in XZ cross-sectional view. For example, the recessed portion 4a1i may be formed by dicing processing. After the sealing portion 4i having a flat surface is formed, the sealing portion 4i having the recessed portion 4a1i having a groove shape in the vicinity of the center of the surface in the X direction can be formed by bringing a dicing blade into contact with the surface in the X direction and rotating the dicing blade while controlling the contact position by NC control or the like. At this time, the recessed portion 4a1i can be formed in a tapered shape in XZ cross-sectional view due to the characteristics of dicing processing. Alternatively, the recessed portion 4a1i may be formed by molding. By preparing a mold including a flat portion having a pedestal portion having a lateral I-shape in the vicinity of the center in the X direction, heating and melting the first insulator, pouring the first insulator into the mold, cooling the first insulator, and removing the mold, it is possible to form the sealing portion 4i having the recessed portion 4a1i in the vicinity of the center of the front surface in the X direction. At this time, it is possible to easily remove the mold by forming the pedestal portion into a tapered shape, and it is possible to improve the throughput of the processing of forming the sealing portion 4i. Alternatively, the recessed portion 4a1i may be formed by laser processing. After the sealing portion 4i having a flat surface is formed, the sealing portion 4i having the recessed portion 4a1i in the vicinity of the center of the surface in the X direction can be formed by irradiating the surface with laser light while controlling the irradiation position in a lateral stripe shape by NC control or the like. At this time, the recessed portion 4a1i can be formed in a tapered shape due to the characteristics of laser processing.

Figure 8:
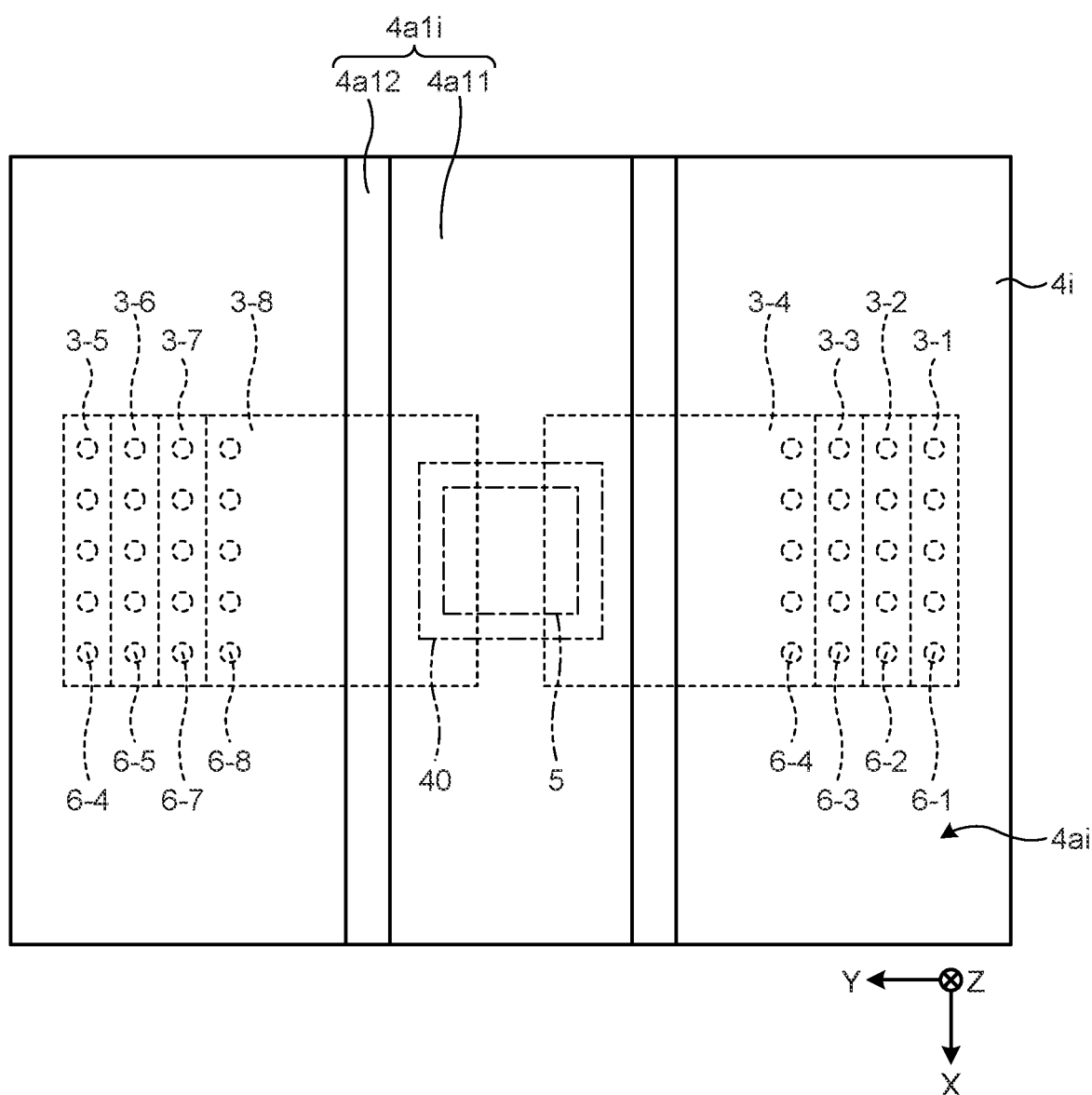
FIG. 8 is a plan view illustrating a method of manufacturing a semiconductor device according to a third modification of the first embodiment.

In addition, the recessed portion 4a1i may be formed as a groove having a vertical I-shape as illustrated in FIG. 8 (having a substantially vertical I-shape in XY plan view). FIG. 8 is a plan view illustrating a method of manufacturing the semiconductor device 1 according to a third modification of the first embodiment. FIG. 8 exemplifies a configuration in which the recessed portion 4a1i is formed as a vertical I-shaped groove. In this case, unlike the first embodiment, the X-direction width of the open end of the recessed portion 4a1 is substantially equal to the X-direction width of the bottom surface 4a11. Note that, as in the first embodiment, the area of the open end of the recessed portion 4a1i is larger than the area of the bottom surface 4a11, and the Y-direction width of the open end of the recessed portion 4a1i is larger than the Y-direction width of the bottom surface 4a11.

The recessed portion 4a1i may be formed in a tapered shape in which the side surface 4a12 is inclined such that the opening width becomes smaller toward the bottom surface 4a11 in YZ cross-sectional view. For example, the recessed portion 4a1i may be formed by dicing processing. After the sealing portion 4i having a flat surface is formed, the sealing portion 4i having the recessed portion 4a1i having a groove shape in the vicinity of the center of the surface in the Y direction can be formed by bringing a dicing blade into contact with the surface in the Y direction and rotating the dicing blade while controlling the contact position by NC control or the like. At this time, the recessed portion 4a1i can be formed in a tapered shape in YZ cross-sectional view due to the characteristics of dicing processing. Alternatively, the recessed portion 4a1i may be formed by molding. By preparing a mold including a flat portion having a pedestal portion having a vertical I-shape in the vicinity of the center in the Y direction, heating and melting the first insulator, pouring the first insulator into the mold, cooling the first insulator, and removing the mold, it is possible to form the sealing portion 4i having the recessed portion 4a1i in the vicinity of the center of the front surface in the Y direction. At this time, it is possible to easily remove the mold by forming the pedestal portion into a tapered shape, and it is possible to improve the throughput of the processing of forming the sealing portion 4i. Alternatively, the recessed portion 4a1i may be formed by laser processing. After the sealing portion 4i having a flat surface is formed, the sealing portion 4i having the recessed portion 4a1i in the vicinity of the center of the surface in the Y direction can be formed by irradiating the surface with laser light while controlling the irradiation position in a vertical stripe shape by NC control or the like. At this time, the recessed portion 4a1i can be formed in a tapered shape due to the characteristics of laser processing.

Figure 9:
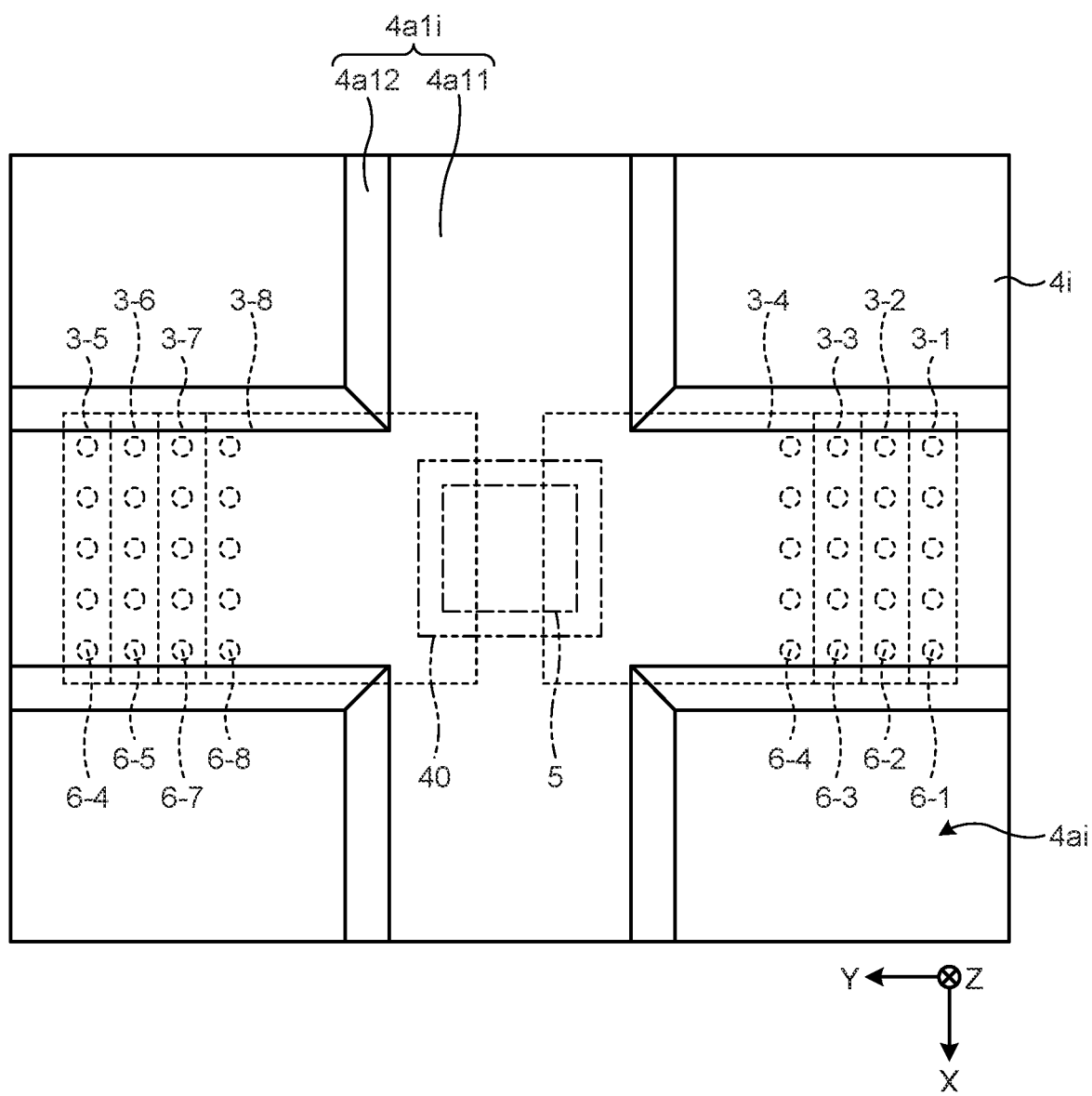
FIG. 9 is a plan view illustrating a method of manufacturing a semiconductor device according to a fourth modification of the first embodiment.

In addition, the recessed portion 4a1i may be formed as a groove having a cross shape as illustrated in FIG. 9 (having a substantially cross shape in XY plan view). FIG. 9 is a plan view illustrating a method of manufacturing the semiconductor device 1 according to a fourth modification of the first embodiment. FIG. 9 exemplifies a configuration in which the recessed portion 4a1i is formed as a cross-shaped groove. In this case, unlike the first embodiment, the X-direction width of the open end of the recessed portion 4a1 is substantially equal to the X-direction width of the bottom surface 4a11 in the vicinity of the center in the Y direction and is larger than the X-direction width of the bottom surface 4a11 in the vicinity of both ends in the Y direction, and the Y-direction width of the open end of the recessed portion 4a1 is substantially equal to the Y-direction width of the bottom surface 4a11 in the vicinity of the center in the X direction and is larger than the Y-direction width of the bottom surface 4a11 in the vicinity of both ends in the X direction. Note that, as in the first embodiment, the area of the open end of the recessed portion 4a1i is larger than the area of the bottom surface 4a11.

The terminals 6-1 to 6-8 are exposed on the bottom surface of the recessed portion 4a1i. The height of the exposed surfaces of the terminals is low. Therefore, electrodes may be formed separately so as to compensate for the height of the terminals. Alternatively, the electrodes 8 and the ball bumps 9 may be formed high.

The portion in the vicinity of both ends of the recessed portion 4a1i in the X direction may be formed in a tapered shape in which the side surface 4a12 is inclined such that the opening width becomes smaller toward the bottom surface 4a11 in YZ cross-sectional view. The portion in the vicinity of both ends of the recessed portion 4a1i in the Y direction may be formed in a tapered shape in which the side surface 4a12 is inclined such that the opening width becomes smaller toward the bottom surface 4a11 in XZ cross-sectional view. For example, the recessed portion 4a1i may be formed by dicing processing. After the sealing portion 4i having a flat surface is formed, the sealing portion 4i having the recessed portion 4a1i having a cross groove shape on the surface can be formed by bringing a dicing blade into contact with the surface in the X direction and rotating the dicing blade and bringing the dicing blade into contact with the surface in the Y direction and rotating the dicing blade while controlling the contact position by NC control or the like. At this time, due to the characteristics of dicing processing, the portion in the vicinity of both ends of the recessed portion 4a1i in the X direction can be formed in a tapered shape in YZ cross-sectional view, and the portion in the vicinity of both ends in the Y direction can be formed in a tapered shape in XZ cross-sectional view. Alternatively, the recessed portion 4a11 may be formed by molding. By preparing a mold including a flat portion having a pedestal portion having a cross shape, heating and melting the first insulator, pouring the first insulator into the mold, cooling the first insulator, and removing the mold, it is possible to form the sealing portion 4i having the recessed portion 4a1i having a cross shape on the surface. At this time, it is possible to easily remove the mold by forming the pedestal portion into a tapered shape, and it is possible to improve the throughput of the processing of forming the sealing portion 4i. Alternatively, the recessed portion 4a1i may be formed by laser processing. After the sealing portion 4i having a flat surface is formed, the sealing portion 4i having the recessed portion 4a1i having a cross shape on the surface can be formed by irradiating the surface with laser light while controlling the irradiation position in a cross shape by NC control or the like. At this time, due to the characteristics of laser processing, the portion in the vicinity of both ends of the recessed portion 4a1i in the X direction can be formed in a tapered shape in YZ cross-sectional view, and the portion in the vicinity of both ends in the Y direction can be formed in a tapered shape in XZ cross-sectional view.

Second Embodiment

Next, a semiconductor device according to the second embodiment will be described. Hereinafter, portions different from those of the first embodiment will be mainly described.

In the first embodiment, the semiconductor device 1 having a structure in which the back surface of the chip 5 is separated from the bottom surface 4a11 of the recessed portion 4a1 is exemplified, but in the second embodiment, a semiconductor device 101 having a structure in which the back surface of a chip 5 is in contact with a bottom surface 4a11 of a recessed portion 4a1 is exemplified.

Figure 10:
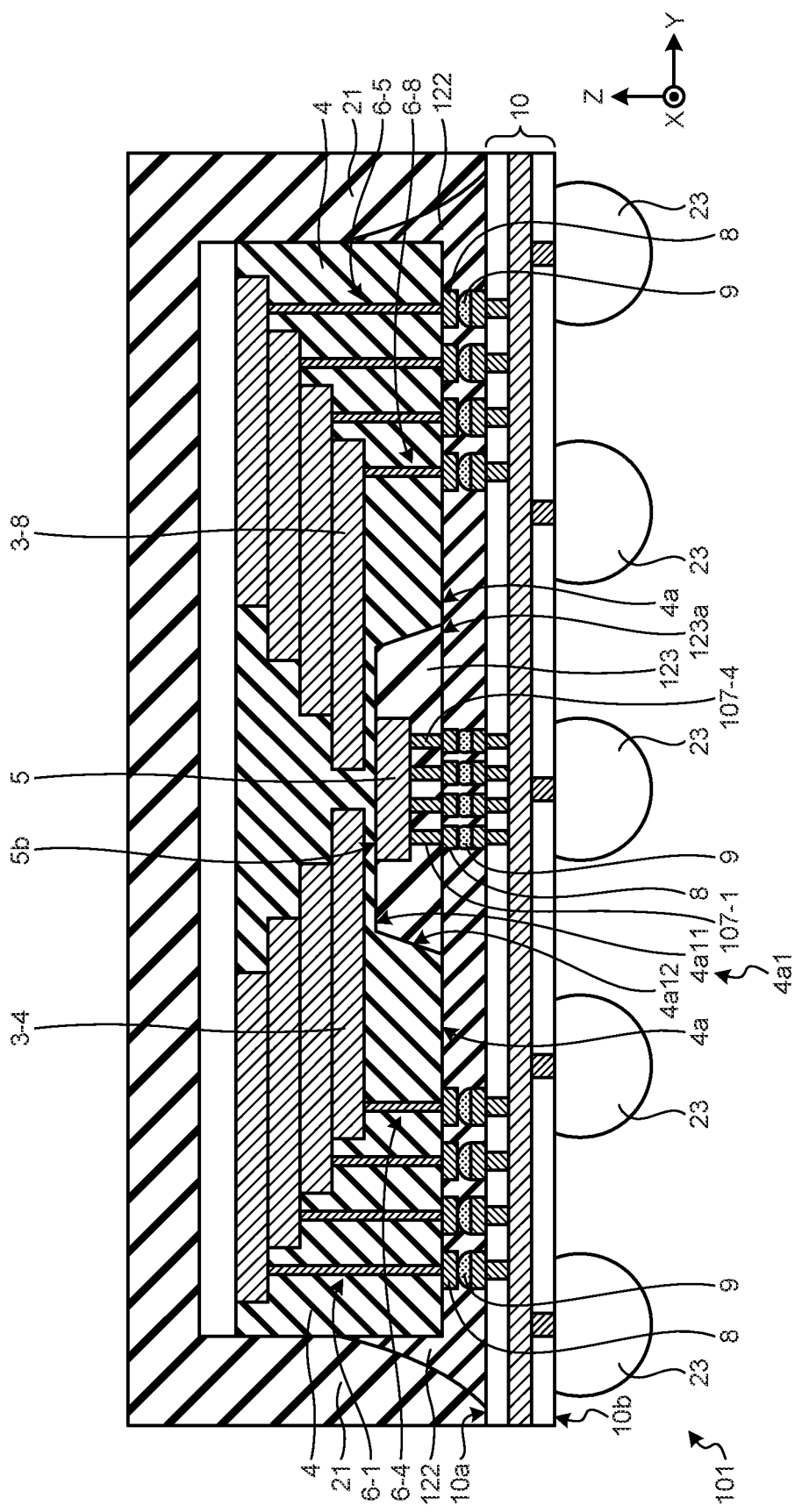
FIG. 10 is a cross-sectional view illustrating a configuration of a semiconductor device according to a second embodiment.

Specifically, in the semiconductor device 101, as illustrated in FIG. 10, a back surface 5b of the chip 5 comes into contact with the bottom surface 4a11 of the recessed portion 4a1. FIG. 10 is a cross-sectional view illustrating a configuration of the semiconductor device 101 according to the second embodiment. As compared with the first embodiment, since a Z-direction distance between the chip 5 and uppermost chips 3-4 and 3-8 among a plurality of chips 3-1 to 3-8 is smaller, the height of the semiconductor device 101 can be reduced.

Note that a sealing portion 4 is interposed between the chip 5 and the chips 3-4 and 3-8. Thus, as in the first embodiment, the chip 5 can be mounted in the vicinity of the center of the sealing portion 4 in XY plan view along the XY direction.

The semiconductor device 101 includes a plurality of terminals 107-1 to 107-4 and a sealing portion 122, instead of multiple terminals 7-1 to 7-4 and the sealing portion 22 (see FIG. 1), and further includes a sealing portion 123. The −Z-side end portions of multiple terminals 107-1 to 107-4 have the Z positions that are substantially the same as the −Z-side end portions of a plurality of terminals 6-1 to 6-8. The sealing portion 123 fills the recessed portion 4a1 and seals the chip 5. A −Z-side surface 123a of the sealing portion 123 and a −Z-side surface 4a of the sealing portion 4 form a continuous surface and have substantially the same Z position. The sealing portion 123 can be formed of a fourth insulator having thermoplasticity such as mold resin. The fourth insulator is different in composition from the first insulator. The fourth insulator may be different in composition from the second insulator and may be different in composition from the third insulator.

The sealing portion 122 and the sealing portion 123 may contain an inorganic filler in an insulating resin. At this time, the content of the filler in the sealing portion 4, the sealing portion 21, and the sealing portion 122 may be larger than the content of the filler in the sealing portion 123. The content of the filler in the sealing portion 4 and the sealing portion 21 may be larger than the content of the filler in the sealing portion 122.

The thermal expansion coefficients of the sealing portion 4, the sealing portion 21, and the sealing portion 122 may be smaller than the thermal expansion coefficient of the sealing portion 123. The thermal expansion coefficients of the sealing portion 4 and the sealing portion 21 may be smaller than the thermal expansion coefficient of the sealing portion 122.

The Young's moduli of the sealing portion 4, the sealing portion 21, and the sealing portion 122 may be larger than the Young's modulus of the sealing portion 123. The Young's moduli of the sealing portion 4 and the sealing portion 21 may be larger than the Young's modulus of the sealing portion 122.

Note that, as in the first embodiment, the −Z-side end portion of each of the terminals 6-1 to 6-8 is connected to an electrode pattern 11 of a substrate 10 via an electrode 8 and a ball bump 9, and the −Z-side end portion of each of the terminals 7-1 to 7-4 is connected to an electrode pattern 11 of the substrate 10 via an electrode 8 and a ball bump 9.

In addition, as illustrated in FIGS. 11A to 13C, a method of manufacturing the semiconductor device 101 is different from that of the first embodiment on the point described below. FIGS. 11A to 11B, 12A to 12C, and 13A to 13C are cross-sectional views illustrating a method of manufacturing the semiconductor device 101.

Figure 11A:
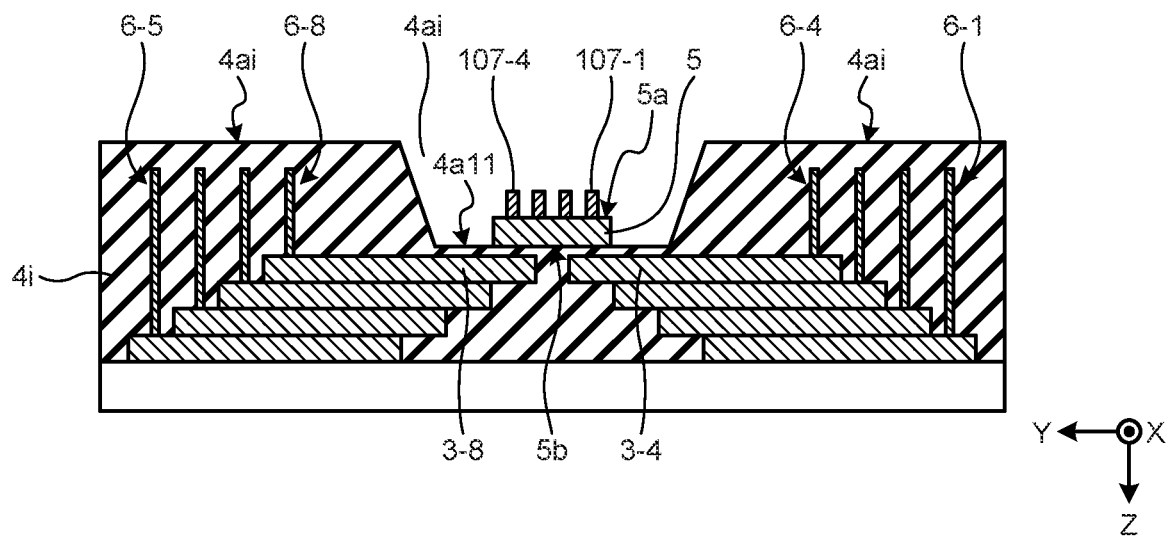
FIGS. 11A and 11B are cross-sectional views illustrating a method of manufacturing the semiconductor device according to the second embodiment.

For example, in the method of manufacturing the semiconductor device 101, after the processes illustrated in FIGS. 2A to 2D are performed, the process illustrated in FIG. 11A may be performed. In the process illustrated in FIG. 11A, the chip 5 and multiple terminals 107-1 to 107-4 are prepared. One end of each of multiple terminals 107-1 to 107-4 is coupled to a corresponding electrode pad on the front surface of the chip 5. The chip 5 to which multiple terminals 107-1 to 107-4 are coupled is disposed on the bottom surface 4a11 of the recessed portion 4a1. As indicated by the one-dot chain lines in FIG. 3, the chip 5 is disposed so as to be included inside the bottom surface 4a11 in XY plan view. The back surface 5b of the chip 5 may be bonded to the bottom surface 4a11 via an adhesive, an adhesive film, or the like.

At this time, in a state where the chip 5 is disposed in the recessed portion 4a1, the −Z-side end portion of each of the terminals 6-1 to 6-8 and the −Z-side end portion of each of the terminals 107-1 to 107-8 may be different from each other within a range in which the positions can be made uniform by polishing.

Figure 11B:
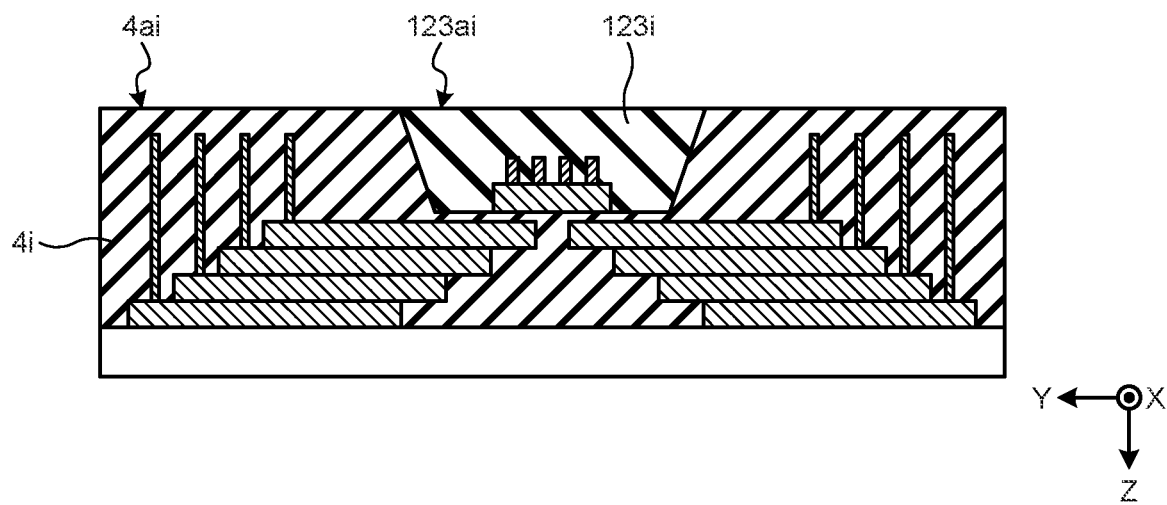

In the process illustrated in FIG. 11B, the fourth insulating material is loaded into a recessed portion 4ai. That is, the front surface and side surfaces of the chip 5 are covered with the fourth insulator and the side surfaces and end surfaces of multiple terminals 107-1 to 107-8 are covered with the fourth insulator to form a sealing portion 123i. Thus, a sealing portion 123i that fills the recessed portion 4ai is formed. The fourth insulating material is different in composition from the first insulator. The fourth insulator may be different in composition from the second insulator and may be different in composition from the third insulator.

At this time, a surface $4ai$ of the sealing portion 4 and a surface $123ai$ of the sealing portion 123 may be different from each other within a range in which the Z positions can be made uniform by polishing.

Figure 12A:
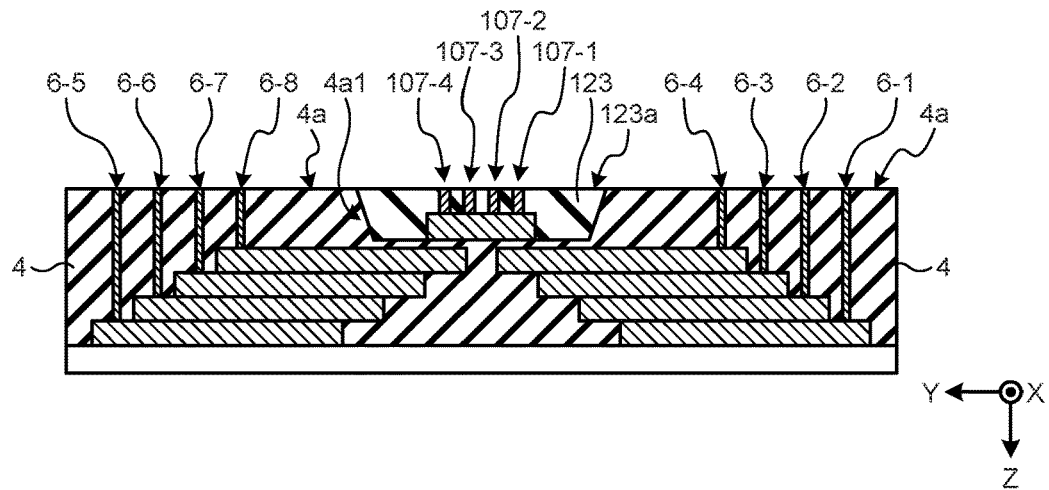
FIGS. 12A to 12C are cross-sectional views illustrating a method of manufacturing the semiconductor device according to the second embodiment.

In the process illustrated in FIG. 12A, the surface $4ai$ of the sealing portion $4i$ and the surface $123ai$ of the sealing portion $123i$ are polished. For example, a grinder of a polishing apparatus is pressed against the surface $4ai$ of the sealing portion $4i$ and the surface $123ai$ of the sealing portion $123i$, and the grinder rotates about an axis perpendicular to the contact surface, and the rotation of the grinder is continued until the −Z-side end portion of each of the terminals 6-1 to 6-8 is exposed to the front surface $4a$ of the sealing portion 4 and the −Z-side end portion of each of the terminals 107-1 to 107-8 is exposed to the surface 123 of the sealing portion 123. The depth of the recessed portion $4a1$ is smaller than that of the recessed portion $4a1i$ (see FIG. 2D) by an amount corresponding to the polishing thickness. The Z-direction thickness of the sealing portion 4 is thinner than that of the sealing portion $4i$ by an amount corresponding to the polishing thickness. The depth of the recessed portion $4a1$ is smaller than that of the recessed portion $4a1i$ by an amount corresponding to the polishing thickness. The Z-direction thickness of the sealing portion 123 is thinner than that of the sealing portion $123i$ by an amount corresponding to the polishing thickness.

At this time, the −Z-side end portion of each of the terminals 6-1 to 6-8 and the −Z-side end portion of each of the terminals 107-1 to 107-8 have substantial the same Z position.

Figure 12B:
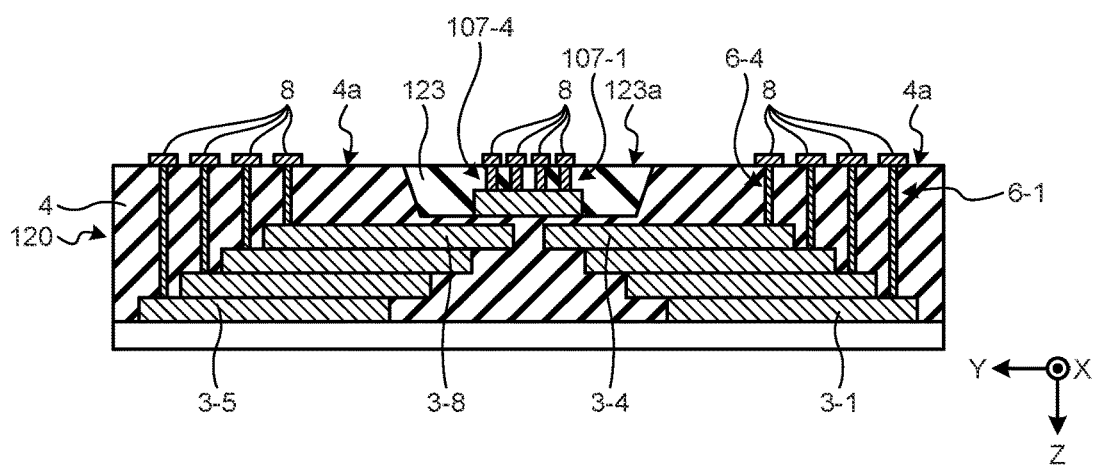

In the process illustrated in FIG. 12B, a plurality of electrodes 8 is formed on the front surface $4a$ of the sealing portion 4, and a plurality of electrodes 8 is formed on the front surface $123a$ of the sealing portion 123. Multiple electrodes 8 formed on the front surface $4a$ of the sealing portion 4 are the same as that in the first embodiment. Multiple electrodes 8 formed on the front surface $123a$ of the sealing portion 123 correspond to multiple terminals 107-1 to 107-4. Each of the electrodes 8 formed on the front surface $123a$ is electrically connected to the −Z-side end portion of the corresponding terminal 107. Thus, an upper structure 120 in which multiple chips 3-1 to 3-8 are face-up mounted and sealed while being stacked stepwise and the chip 5 is sealed in a state of being able to be face-down mounted is obtained.

Figure 12C:
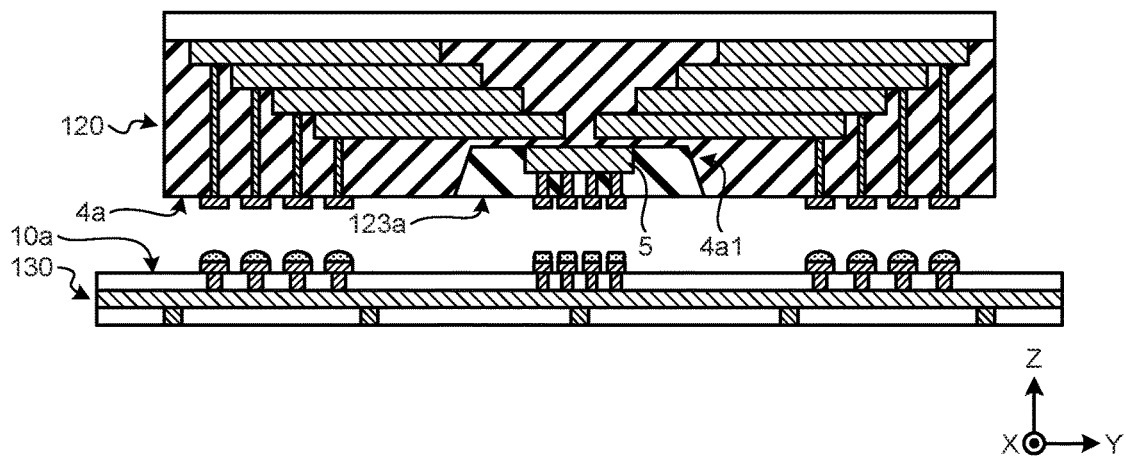

In the process illustrated in FIG. 12C, the substrate 10 is prepared. The ball bump 9 is coupled to each of multiple electrode patterns 11 exposed on the front surface $10a$ of the substrate 10. Thus, a lower structure 130 in which the chip 5 is configured in a state of being able to be face-down mounted is obtained.

The upper structure 120 and the lower structure 130 are arranged to face each other such that the front surfaces $4a$ and $123a$ and the front surface $10a$ face each other. When viewed from the Z direction, the relative positions of the upper structure 120 and the lower structure 130 are aligned such that the electrodes 8 of the upper structure 120 and the ball bumps 9 of the lower structure 130 overlap each other.

Figure 13A:
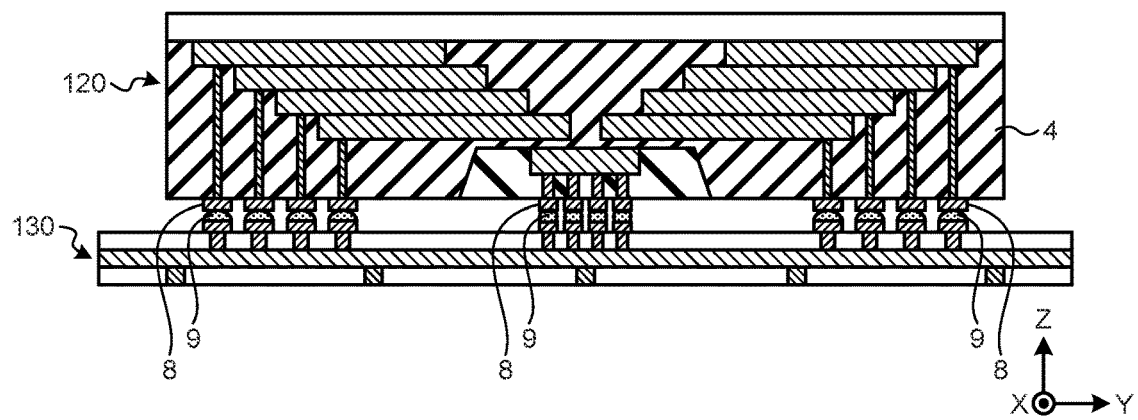
FIGS. 13A to 13C are cross-sectional views illustrating a method of manufacturing the semiconductor device according to the second embodiment.

In the process illustrated in FIG. 13A, the upper structure 120 and the lower structure 130 are relatively brought close to each other in the Z direction. The electrodes 8 of the upper structure 120 and the ball bumps 9 of the lower structure 130 are coupled to each other.

Figure 13B:
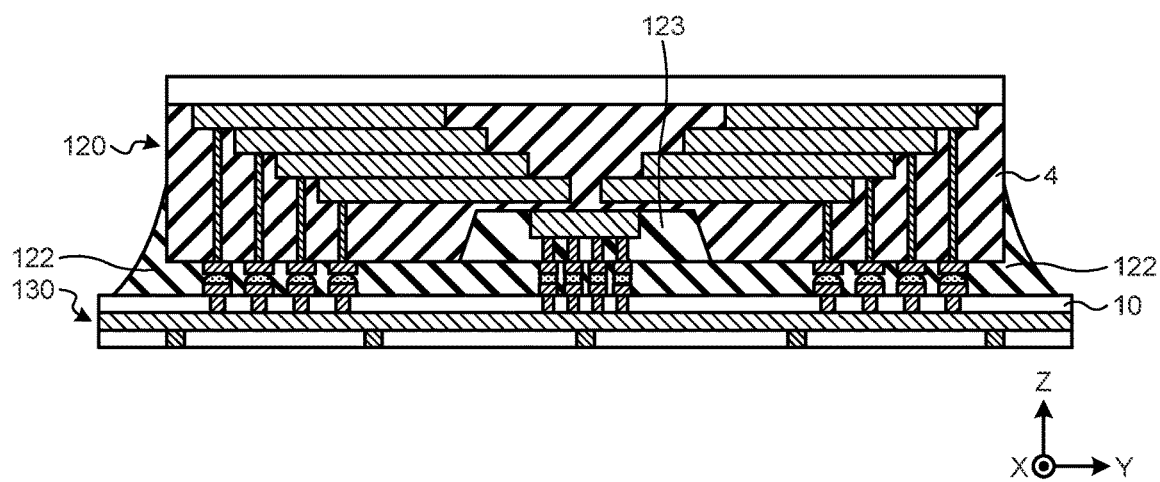

In the process illustrated in FIG. 13B, the gap between the upper structure 120 and the lower structure 130 is sealed by the sealing portion 122. The sealing portion 122 is loaded to fill the gap between the sealing portions 4 and 123 and the substrate 10. The sealing portion 122 can be formed of the second insulator having thermoplasticity such as mold resin. Thus, the electrodes 8 and the ball bumps 9 are sealed by the sealing portion 122.

Figure 13C:
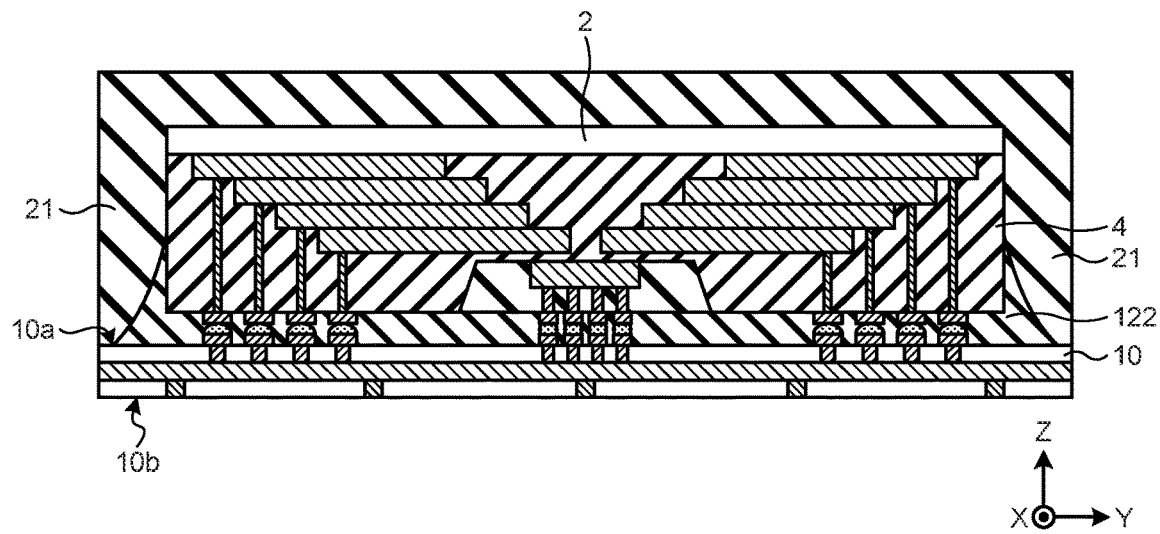

In the process illustrated in FIG. 13C, the outside of the upper structure 120 is sealed by the sealing portion 21. The sealing portion 21 is formed to cover a support 2, the sealing portion 4, and the sealing portion 122 from the outside. The sealing portion 21 may be formed so as to reach the front surface $10a$ of the substrate 10. The sealing portion 21 can be formed of a third insulator having thermoplasticity such as mold resin. The third insulator is different in composition from the first insulator and different in composition from the second insulator.

In the process illustrated in FIG. 10, multiple external electrodes 23 are mounted on the back surface $10b$ of the substrate 10. The external electrodes 23 can be joined to the through-hole electrodes 14 exposed on the back surface $10b$ of the substrate 10. Then, the semiconductor device 101 is obtained through singulation by cutting.

As described above, in the second embodiment, in the semiconductor device 101, the recessed portion $4a1$ is provided in the vicinity of the center of the front surface $4a$ of the sealing portion 4 in XY plan view that seals multiple stacked chips 3-1 to 3-8. The chip 5 is accommodated in the recessed portion $4a1$. Thus, since it is easy to wire the chip 5 to multiple chips 3-1 to 3-8 at substantially equal distances, it is possible to provide the semiconductor device 101 having a structure suitable for appropriately arranging each of multiple chips 3-1 to 3-8 and the chip 5.

Third Embodiment

Next, a semiconductor device according to the third embodiment will be described. Hereinafter, portions different from those of the first embodiment and the second embodiment will be mainly described.

In the second embodiment, the semiconductor device 101 having a structure in which the terminals 6-1 to 6-8 and 107-1 to 107-4 are connected to the external electrodes 23 via the substrate 10 is exemplified, but in the third embodiment, a semiconductor device 201 having a structure in which terminals 6-1 to 6-8 and 107-1 to 107-4 are connected to external electrodes 23 via a rewiring layer 240 is exemplified.

Figure 14:
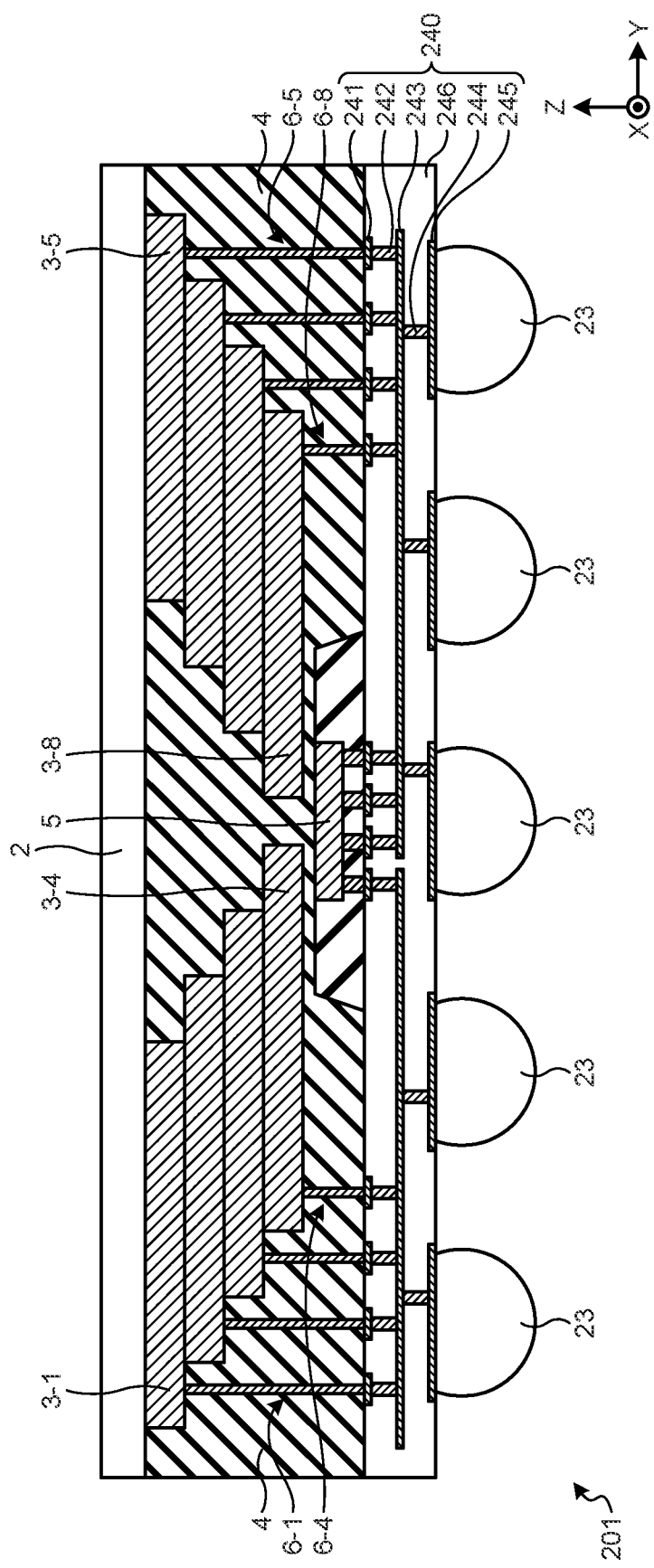
FIG. 14 is a cross-sectional view illustrating a configuration of a semiconductor device according to a third embodiment.

Specifically, in the semiconductor device 201, as illustrated in FIG. 14, the electrodes 8, the ball bumps 9, and the sealing portion 21 (see FIG. 10) are omitted, and the rewiring layer 240 is disposed instead of the substrate 10. FIG. 14 is a cross-sectional view illustrating a configuration of the semiconductor device 201 according to the third embodiment. As compared with the second embodiment, the Z-direction distance between the terminals 6-1 to 6-8 and 107-1 to 107-4 and the external electrodes 23 is further reduced, and the Z height is reduced by the thickness of the sealing portion 21, so that the height of the semiconductor device 201 can be further reduced.

Note that a sealing portion 4 is interposed between the chip 5 and the chips 3-4 and 3-8. Thus, as in the first embodiment and the second embodiment, the chip 5 can be mounted in the vicinity of the center of the sealing portion 4 in XY plan view along the XY direction.

In the semiconductor device 201, the rewiring layer 240 includes a plurality of layers of wiring for connecting the terminals 6-1 to 6-8 and 107-1 to 107-4 and the external electrodes 23. The rewiring layer 240 includes, for example, three wiring layers, and includes a wiring layer 241, a plug layer 242, a wiring layer 243, a plug layer 244, a wiring layer 245, and an interlayer insulating film 246.

The −Z-side end portions of multiple terminals 6-1 to 6-8 are each connected to electrode patterns of the wiring layer 241. The −Z-side end portions of multiple terminals 107-1 to 107-4 are each connected to electrode patterns of the wiring layer 241.

Multiple external electrodes 23 are each connected to electrode patterns of the wiring layer 245.

The electrode patterns of the wiring layer 241 and the electrode patterns of the wiring layer 245 can be connected via plugs of the plug layer 242, line patterns of the wiring layer 243, plugs of the plug layer 244, or the like. Thus, the terminals 6-1 to 6-8 and 107-1 to 107-4 are connected to the external electrodes 23 via the rewiring layer 240.

In addition, as illustrated in FIG. 14, a method of manufacturing the semiconductor device 201 is different from that of the second embodiment on the point described below. FIG. 14 is a cross-sectional view illustrating a configuration of the semiconductor device 201, but is used as a cross-sectional view illustrating a method of manufacturing the semiconductor device 201.

For example, in the method for manufacturing the semiconductor device 201, the process illustrated in FIG. 14 may be performed after the processes illustrated in the drawings up to FIG. 12A are performed as in the second embodiment. In the process illustrated in FIG. 14, a conductive layer 241i is deposited on a front surface 4a of the sealing body 4 and a front surface 123a of a sealing portion 123 by a vapor deposition method, a plating method, or the like. A resist pattern RP1 that selectively covers the −Z-side end portions of multiple terminals 6-1 to 6-8 and the −Z-side end portions of multiple terminals 107-1 to 107-4 are formed thereon. The conductive layer 241i is etched using the resist pattern RP1 as a mask. Thus, the wiring layer 241 including electrode patterns that selectively cover the −Z-side end portions of multiple terminals 6-1 to 6-8 and the −Z-side end portions of multiple terminals 107-1 to 107-4 are formed.

Next, an insulating film 246i covering the wiring layer 241 is deposited. A resist pattern RP2 having openings at the positions of the electrode patterns of the wiring layer 241 is formed thereon. The insulating film 246i is etched using the resist pattern RP2 as a mask. Holes for selectively exposing the electrode patterns of the wiring layer 241 are formed. A conductive material such as tungsten is embedded in the holes. Thus, the plugs of the plug layer 242 connected to the electrode patterns of the wiring layer 241 are formed.

Similarly, the wiring layer 243, the plug layer 244, and the wiring layer 245 are formed.

Then, multiple external electrodes 23 are mounted on the −Z-side surface of the rewiring layer 240. The external electrodes 23 are coupled to the electrode patterns of the wiring layer 245. Then, the semiconductor device 201 is obtained through singulation by cutting.

As described above, in the third embodiment, in the semiconductor device 201, a recessed portion 4a1 is provided in the vicinity of the center of the front surface 4a of the sealing portion 4 in XY plan view that seals multiple stacked chips 3-1 to 3-3. The chip 5 is accommodated in the recessed portion 4a1. Thus, since it is easy to wire the chip 5 to multiple chips 3-1 to 3-8 at substantially equal distances, it is possible to provide the semiconductor device 201 having a structure suitable for appropriately arranging each of multiple chips 3-1 to 3-8 and the chip 5.

Other Embodiments (a) In the first embodiment and the second embodiment, the sealing portion 4 may be provided instead of the sealing portion 22 and the sealing portion 122. For example, in FIG. 5B, the sealing portion 22 is not provided, and sealing is directly performed by the sealing portion 4. Similarly in the second embodiment, the process of providing the sealing portion 122 in FIG. 13B can be deleted. Thus, the manufacturing cost can be reduced. At this time, the sealing portion 21 is provided between the sealing portion 4 and the substrate 10.

(b) In the first embodiment, the terminals of the chip 5 are connected to the terminals provided on the substrate 10 by flip chip bonding with the chip 5 being in a face-down state. At this time, the circuit surface of the chip 5 is formed to face the substrate 10 side. Alternatively, the terminals of the chip 5 may be connected to the terminals provided on the substrate 10 by wire bonding. At this time, the circuit surface of the chip 5 is formed on a surface opposite to the substrate 10. Connection by wire bonding enables formation at low cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a support;
   multiple first chips that are stacked on the support;
   a first sealing portion that seals the multiple first chips and has a recessed portion including a bottom surface separated from the multiple first chips on a surface of the first sealing portion opposite to the support;
   a second chip that is disposed in the recessed portion and has a function different from a function of the first chips;
   multiple first terminals that correspond to the multiple first chips, each of the multiple first terminals extending in a stacking direction from a surface of the first chip opposite to the support and penetrating the first sealing portion; and
   a second terminal that is disposed on a surface of the second chip opposite to the support.

2. The semiconductor device according to claim 1, wherein:
   each of the first chips comprises a memory chip,
   the second chip comprises a controller chip, and
   the first sealing portion has the recessed portion in a vicinity of a center of the surface of the first sealing portion as viewed in plan view.

3. The semiconductor device according to claim 1, wherein the recessed portion includes the second chip therein as viewed in plan view.

4. The semiconductor device according to claim 3, wherein;

the second chip has a substantially rectangular shape as viewed in plan view, and the recessed portion has a substantially rectangular shape as viewed in plan view.

5. The semiconductor device according to claim 3, wherein:

the second chip has a substantially rectangular shape as viewed in plan view, and the recessed portion has a substantially I shape as viewed in plan view.

6. The semiconductor device according to claim 3, wherein:

the second chip has a substantially rectangular shape as viewed in plan view, and the bottom surface of the recessed portion has a substantially cross shape as viewed in plan view.

7. The semiconductor device according to claim 1, wherein the bottom surface of the recessed portion is separated from a back surface of the second chip.

8. The semiconductor device according to claim 1, wherein the bottom surface of the recessed portion is in contact with a back surface of the second chip.

9. The semiconductor device according to claim 1, further comprising:

a second sealing portion that fills at least the recessed portion and seals the second chip.

10. The semiconductor device according to claim 9, further comprising:

a substrate that is disposed on a side opposite to the first sealing portion across the second sealing portion in the stacking direction.

11. The semiconductor device according to claim 10, wherein:

the second sealing portion fills the recessed portion and covers the first sealing portion, and the substrate covers the second sealing portion.

12. The semiconductor device according to claim 10, further comprising:

a third sealing portion that is disposed between the second sealing portion and the substrate and covers the first sealing portion.

13. The semiconductor device according to claim 9, further comprising:

a wiring layer that covers a surface of the first sealing portion and a surface of the second sealing portion and to which the multiple first terminals are electrically connected and to which the second terminal is electrically connected.

14. The semiconductor device according to claim 9, wherein:

the second terminal extends from the second chip in the stacking direction, and a height of an end of the second terminal from the support is substantially equal to a height of a surface of the second sealing portion from the support.

15. The semiconductor device according to claim 1, further comprising:

a buffer member that is interposed between the bottom surface of the recessed portion and the second chip.

16. The semiconductor device according to claim 1, wherein a height of an end of the first terminals from the support is substantially equal to a height of a surface of the first sealing portion from the support.

17. The semiconductor device according to claim 1, wherein:

the second terminal extends from the second chip in the stacking direction, and a height of an end of the second terminal from the support is substantially equal to a height of an end of the first terminals from the support.

18. The semiconductor device according to claim 17, wherein:

a height of an end of the first terminals from the support is substantially equal to a height of a surface of the first sealing portion from the support, and a height of an end of the second terminal from the support is substantially equal to a height of a surface of the second sealing portion from the support.

19. The semiconductor device according to claim 17, further comprising:

a second sealing portion that fills at least the recessed portion and seals the second chip; and a substrate that is disposed on a side opposite to the first sealing portion across the second sealing portion in the stacking direction, wherein:

each of the first terminals is connected to the substrate, and the second terminal is connected to the substrate.

20. The semiconductor device according to claim 17, further comprising:

a second sealing portion that fills at least the recessed portion and seals the second chip; and a wiring layer that covers a surface of the first sealing portion and a surface of the second sealing portion and to which the multiple first terminals are electrically connected and to which the second terminal is electrically connected, wherein:

each of the first terminals is connected to the wiring layer, and the second terminal is connected to the wiring layer.

* * * * *